(12) United States Patent
Dolman

(10) Patent No.: US 6,396,345 B2
(45) Date of Patent: May 28, 2002

(54) PHASE AND AMPLITUDE DETECTOR AND METHOD OF DETERMINING ERRORS

(75) Inventor: Graham Ainsley Dolman, Saffron Walden (GB)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 09/761,599

(22) Filed: Jan. 16, 2001

Related U.S. Application Data

(63) Continuation-in-part of application No. 09/469,138, filed on Dec. 21, 1999, now abandoned.

(51) Int. Cl.[7] .................................. H03G 1/26
(52) U.S. Cl. ........................... 330/149; 455/126
(58) Field of Search ................. 330/149, 136, 330/129, 107; 375/296, 297; 327/1; 455/126, 63

(56) References Cited

U.S. PATENT DOCUMENTS

| | | | | |
|---|---|---|---|---|
| 5,650,758 A | * | 7/1997 | Xu et al. | 330/149 |
| 5,742,201 A | * | 4/1998 | Eisenberg et al. | 330/136 |
| 5,892,397 A | * | 4/1999 | Belcher et al. | 330/136 |
| 5,903,611 A | * | 5/1999 | Schnabl et al. | 375/296 |
| 6,029,285 A | * | 2/2000 | Belcher et al. | 330/136 |
| 6,054,896 A | * | 4/2000 | Wright et al. | 330/149 |
| 6,141,390 A | * | 10/2000 | Cova | 330/149 |
| 6,275,685 B1 | * | 8/2001 | Wessel et al. | 455/126 |

FOREIGN PATENT DOCUMENTS

| | | | |
|---|---|---|---|
| EP | 1111682 | * 12/2000 | H03F/1/32 |

* cited by examiner

Primary Examiner—Robert Pascal
Assistant Examiner—Khanh V. Nguyen
(74) Attorney, Agent, or Firm—Lee, Mann, Smith, McWilliams, Sweeney, & Ohlson

(57) ABSTRACT

This invention relates to a phase and amplitude detector (160) required to identify small signal errors in a signal envelope having a large dynamic range, especially in the context of linearization of a power amplifier (122) arrangement employing a pre-distortion technique. A vector generator (300, 352, 372) responsive to a reference signal $\underline{R}$ (110) produces a frame of reference vectors $\underline{R}_1$–$\underline{R}_n$ (274–280) generated by a combination of the reference signal $\underline{R}$ (110) with first $\underline{A}$ (270) and second $\underline{P}$ (272) offset vectors that provide an amplitude and phase displacement of the reference signal $\underline{R}$ (110). A signal combiner (290–296, 360–366, 390–396) is arranged to generate difference vectors $\underline{E}_1$–$\underline{E}_n$ by combining the frame of reference vectors $\underline{R}_1$–$\underline{R}_n$ (274–280) and the feedback signal $\underline{F}$ (124, 150), with the difference vectors $\underline{E}_1$–$\underline{E}_n$ expressing the phase (p, 254) and the gain (a, 252) error terms relative to the reference signal $\underline{R}$ (110) and the first $\underline{A}$ (270) and second $\underline{P}$ (272) offset vectors. An error signal detector, (330–336) responsive to the difference vectors $\underline{E}_1$–$\underline{E}_n$ and arranged to provide a measure of the phase (p, 254) and the gain (a, 252) error terms, provides signal amplitudes that can be combined to generate error signals (182 (Y), 184 X)). The error signals take the general form:

$$X = P_1 - P_2 - P_3 + P_4 = -8\underline{P}p\underline{R};$$

$$Y = P_1 + P_2 - P_3 - P_4 = -8\underline{A}a\underline{R}$$

19 Claims, 14 Drawing Sheets

Figure 2: Prior Art

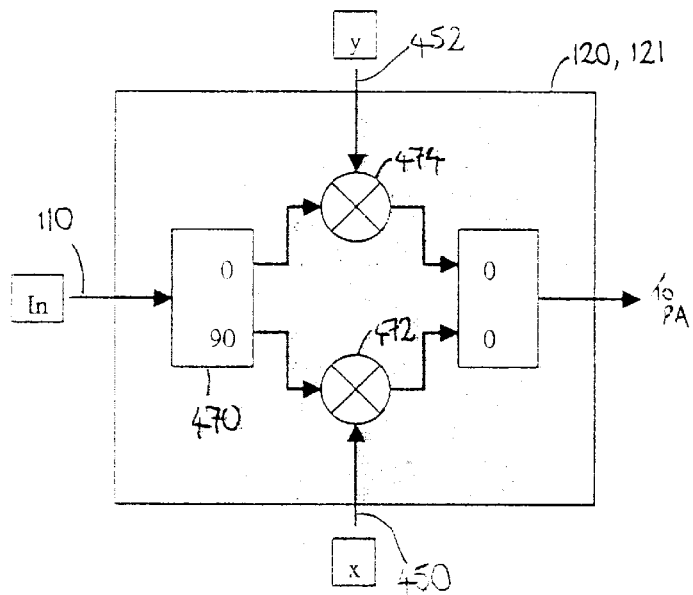
Figure 13
Figure 14
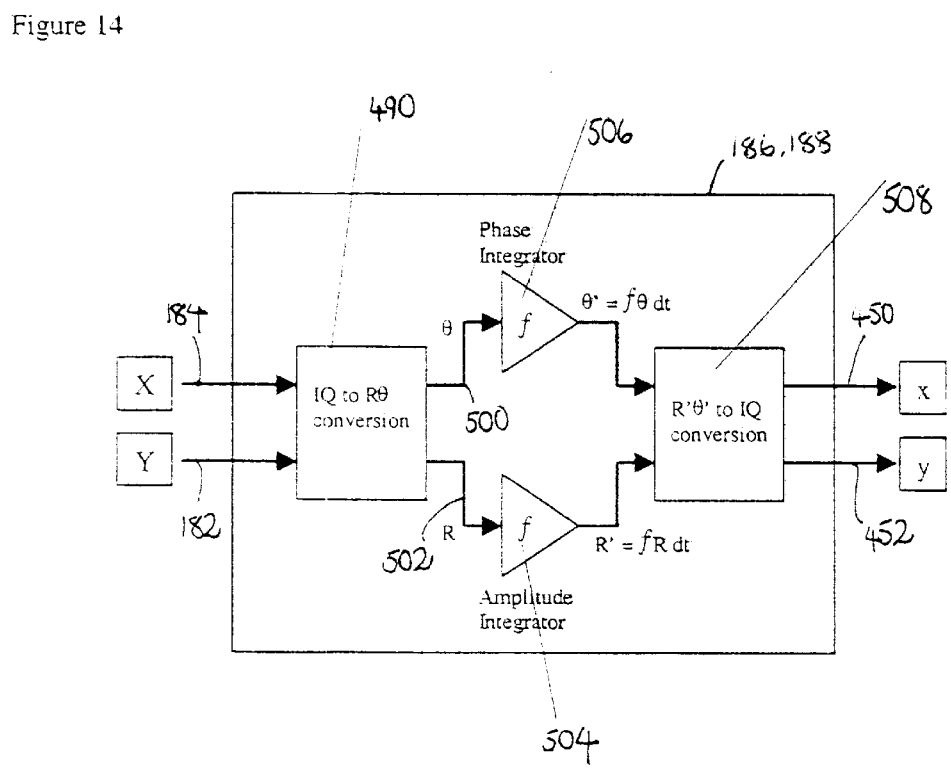

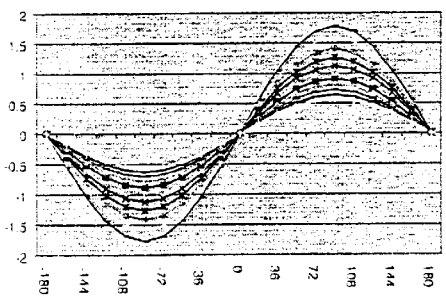
Figure 15a
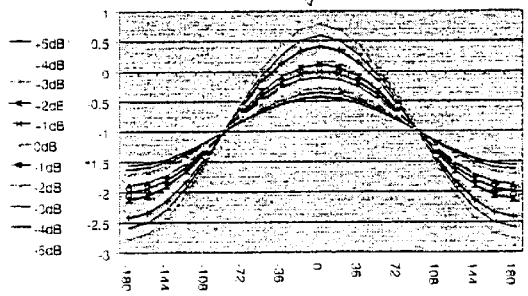
Figure 15c
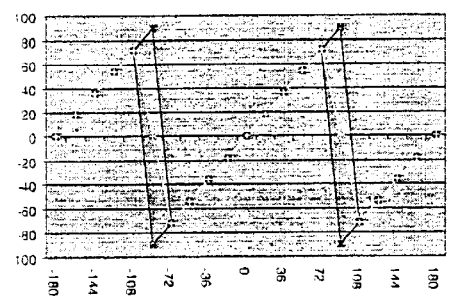
Figure 15b
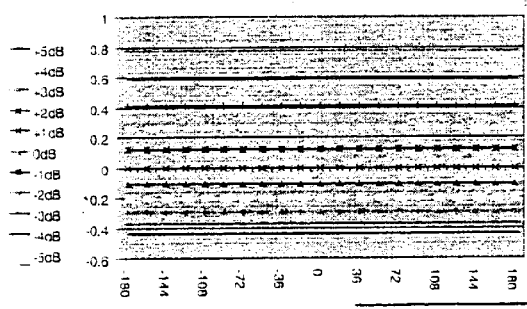
Figure 15d → phase error
Figure 15
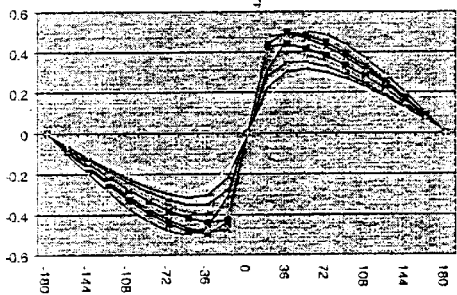
Figure 16a
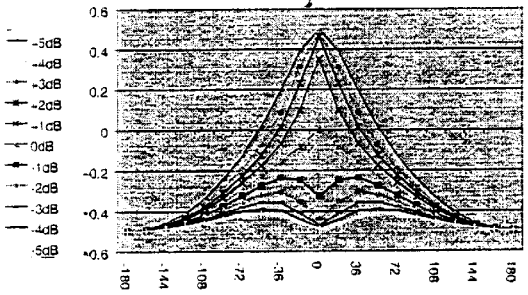
Figure 16c
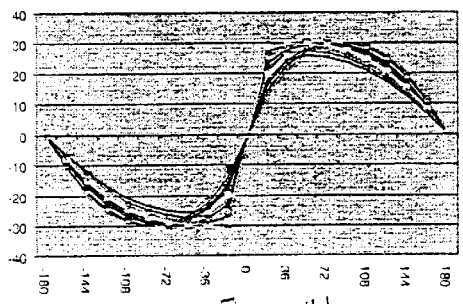
Figure 16b
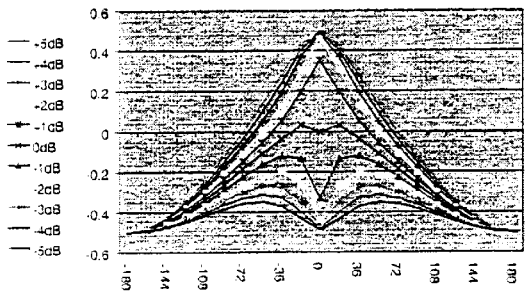
Figure 16d
Figure 16

PHASE AND AMPLITUDE DETECTOR AND METHOD OF DETERMINING ERRORS

RELATED APPLICATIONS

This application is a continuation-in-part of U.S. patent application Ser. No. 09/469,138, filed Dec. 21, 1999, and now abandoned.

FIELD OF THE INVENTION

This invention relates, in general, to a phase and amplitude detector and a method of determining errors, and is particularly, but not exclusively, applicable to the measurement of phase and amplitude errors for compensation purposes in the linearisation of power amplifiers.

BACKGROUND OF THE INVENTION

First and second generation cellular systems have historically used forms of signal modulation which are either constant envelope (e.g. Gaussian Minimum Shift Keying (GMSK) in the global system for mobile communication (GSM) or which result in relatively low levels of amplitude modulation. The linearity of the high power amplifiers used for such systems has therefore not been an important technical issue. Indeed, for constant envelope systems, it is standard practice to operate amplifiers either close to or actually in compression in order to maximise power efficiency. That is to say, the amplifiers are intentionally employed in a non-linear mode.

Third generation cellular systems, however, typically use linear spread-spectrum modulation schemes with a large amount of amplitude modulation on the signal envelope. When passed through a high power amplifier, the output is typically distorted in amplitude and phase by the inherent non-linearity of the amplifier. The amplitude and phase distortion effects are commonly referred to as AM—AM conversion and AM-PM conversion, respectively. Both distortion effects are principally a function of the amplitude envelope of the input signal and are insensitive to the input phase envelope.

In Code Division Multiple Access (CDMA) modulation schemes, quadrature amplitude modulation (QAM) and systems employing similar linear transmission mechanisms, a plurality of signals are simultaneously amplified and transmitted which cause the generation of a large amplitude component in the signal envelope. Unfortunately, when a large amplitude component is applied to a linear amplifier, its non-linear characteristics will tend to produce intermodulation products that reduce signal quality and can cause spectral spillage outside a particular licensed spectrum. Intermodulation products must, therefore, be controlled, but such control, as will be appreciated, should not be at the expense of reducing wanted signal strength.

Intermodulation products and associated distortion can be reduced by negative feedback of the distortion components, pre-distortion of the signal to be amplified to cancel the amplifier generated distortion, or by separating the distortion components from the amplifier output and feeding forward the distortion components to cancel the distortion of the amplifier output signal.

In a power amplifier, where linearisation is performed by correction as a function of signal envelope (either via feedback or via pre-distortion), there is a need for an accurate amplitude and phase comparator that can operate over the full dynamic range of the input signal. In addition, it is desirable for the detector to have a high processing speed to cope with wideband spread spectrum signals. In other words, whilst maintaining low cost and high efficiency design, power amplifiers require ancillary error detection circuitry that can identify and allow correction for non-linearity. Indeed, such correction circuitry is critically dependent upon an ability to measure accurately the phase and amplitude of both the input and output signals to the power amplifier, which signals generally (and, in the exemplary case of CDMA-based systems, inherently) have signal envelopes with associated large dynamic ranges (typically ~20 decibels). In fact, with this ancillary error detection circuitry, there is a requirement to measure small error components (typically of the order of a few tenths of a decibel) in amplitude and phase with respect to relatively large wanted signal excursions/envelopes.

Typical amplifier architectures incorporate a slow feedback loop to track out unit-to-unit variations, thermal drift and long-term component drift. The slow feedback loop eases amplifier set-up and allows a fast feedback or a pre-distortion mechanism to operate only on the amplifier induced, envelope-dependant distortion components. However, conventional phase and amplitude detectors of sufficient performance (associated with linearisation and specifically phase and amplitude error correction in a fast loop) have proven to be extremely difficult to set-up and to replicate on a commercial basis. In any event, it is desirable that a common detector mechanism is used to close both the fast error loop and the (somewhat auxiliary) slow feedback loop to ensure that both loops converge on a single phase/amplitude state.

SUMMARY OF THE INVENTION

In accordance with a first aspect of the present invention there is provided a detector operable to provide at least one error signal associated with at least one of a phase error term and an gain error term between a reference signal $\underline{R}$ and a feedback signal F, the detector characterised by: a vector generator responsive to the reference signal $\underline{R}$, the vector generator producing a frame of reference vectors $\underline{R}_1$–$\underline{R}_n$ generated by a combination of the reference signal $\underline{R}$ with first $\underline{A}$ and second $\underline{P}$ offset vectors that provide an amplitude and phase displacement of the reference signal $\underline{R}$; a signal combiner arranged to generate difference vectors $\underline{E}_1$–$\underline{E}_n$ by combining the frame of reference vectors $\underline{R}_1$–$\underline{R}_n$ and the feedback signal F, the difference vectors $\underline{E}_1$–$\underline{E}_n$. expressing the phase (p) and the gain (a) error terms relative to the reference signal $\underline{R}$ and the first $\underline{A}$ and second $\underline{P}$ offset vectors; and an error signal detector responsive to the difference vectors $\underline{E}_1$–$\underline{E}_n$ and arranged to provide a measure of the phase (p) and the gain (a) error terms required to support subsequent generation of the at least one error signal.

In a preferred embodiment, a combinatory circuitry coupled to the error signal detector is arranged to receive output signals from the error signal detector, the combinatory circuitry configured to isolate the phase error term and the gain error term in terms of the first $\underline{A}$ and second $\underline{P}$ offset vectors and the reference carrier vector $\underline{R}$.

Preferably, the combinatory circuitry generates the at least one error signal through isolation of the phase error term from the gain error term, the at least one error term satisfying the general form:

$$X = P_1 - P_2 - P_3 + P_4 = -8\underline{P}p\underline{R};$$
$$Y = P_1 + P_2 - P_3 - P_4 = -8\underline{A}a\underline{R}$$

where a is the gain error term, p is the phase error term and $P_n$ are output amplitudes from the signal error detector for corresponding difference vectors $\underline{E}_1$–$\underline{E}_n$.

In another aspect of the present invention there is provided a phase and amplitude comparator operable to provide signals relating to the difference in phase and amplitude between a reference signal $\underline{R}$ and a feedback signal F, wherein the comparator comprises vector generating means to produce four reference vectors $\underline{R}_1$–$\underline{R}_n$ which are related to the input reference vector signal $\underline{R}$ by the addition of further vectors $\pm\underline{A}$ and $\pm\underline{P}$ which are, respectively, in phase and in quadrature with $\underline{R}$ such that:

$\underline{R}_1=\underline{R}+\underline{A}+\underline{P}$;

$\underline{R}_2=\underline{R}+\underline{A}-\underline{P}$;

$\underline{R}_3=\underline{R}-\underline{A}-\underline{P}$;

$\underline{R}_4=\underline{R}-\underline{A}+\underline{P}$;

wherein the four reference vectors $\underline{R}_1$–$\underline{R}_n$ are added to four samples of the feedback signal F to produce four corresponding error vectors $E_1$–$E_4$ whereby the vectors $E_1$–$E_4$ can be used to generate phase (X) and amplitude (Y) comparative signals.

In another aspect of the present invention there is provided an amplifier circuit comprising: an input coupled to receive, in use, a reference signal $\underline{R}$; phase and gain modulators coupled to the input; an amplifier coupled to the phase and gain modulators; a first directional coupler coupled to the input and arranged to sample the reference signal $\underline{R}$; a second directional coupler coupled to the amplifier and arranged to sample an amplified version of the reference signal $\underline{R}$, thereby to provide a feedback signal F; and a detector according to the first aspect, the detector coupled to the first directional coupler and the second directional coupler to receive, in use, the reference signal $\underline{R}$ and the feedback signal F; wherein the phase and gain modulators are arranged to receive phase and gain corrections signals derived from the at least one error signal (Y, X) generated by the detector.

In a preferred embodiment the amplifier circuit further comprises an adaptive pre-distorter coupled to receive the at least one error signal from the detector, the adaptive pre-distorter further coupled to the phase and gain modulators, the adaptive pre-distorter arranged to determine the gain and phase error correction signals with respect to a set of look-up values, thereby to linearise performance of the amplifier.

Preferably, a slow feedback loop containing a phase/amplitude equalizer having a second amplitude modulator and a second phase modulator coupled to the amplifier, the phase/amplitude equalizer further containing baseband processing elements coupled to the detector and arranged to receive, in use, the at least one error signal as a control signal for the baseband processing elements, whereby the phase/amplitude equalizer is arranged to track out circuit variations arising from at least one of unit-to-unit variations, thermal drift and long-term component drift through amplitude and phase control of, respectively, the second amplitude modulator and the second phase modulator.

The phase amplitude equalizer may further include: a quadrature to amplitude/phase (R, θ) domain converter coupled to receive the at least one error signal and arranged to provide distinct phase angle θ and amplitude R components; a phase integrator coupled to the quadrature to amplitude/phase (R, θ) domain converter and arranged to receive, in use, the phase angle θ component, thereby to provide a first time-integrated signal having a wrap-around phase correction function; an amplitude integrator coupled to the quadrature to amplitude/phase (R, θ) domain converter and arranged to receive, in use, the phase angle θ component, thereby to provide a second time-integrated signal; and an amplitude/phase (R, θ) domain to quadrature converter coupled to the phase integrator and the amplitude integrator and arranged, in use, to combine the first time-integrated signal and the second time-integrated signal to exercise control of the slow feedback loop.

The amplifier circuit may have at least one delay line operable to compensate for any delay skew induced by processing delay in a correction path between the reference signal and correction signals.

The detector, the phase and amplitude comparator or the amplifier circuit may be incorporated within a base station or a subscriber unit of a cellular communication system or other signaling scheme requiring linear performance.

In a further aspect of the present invention there is provided a method of detecting at least one of a phase error term and an amplitude error term between a reference signal $\underline{R}$ and a feedback signal F and generating a corresponding error signal in response to the least one of the phase error term and the amplitude error term, the method characterised by: producing a frame of reference vectors $\underline{R}_1$–$\underline{R}_n$ generated by a combination of the reference signal $\underline{R}$ with first $\underline{A}$ and second $\underline{P}$ offset vectors that provide an amplitude and phase displacement of the reference signal $\underline{R}$; generating difference vectors $E_1$–$\underline{E}_n$ by combining the frame of reference vectors $\underline{R}_1$–$\underline{R}_n$ and the feedback signal F, the difference vectors $E_1$–$\underline{E}_n$ expressing the phase and the amplitude error terms relative to the reference signal $\underline{R}$ and the first $\underline{A}$ and second $\underline{P}$ offset vectors; and providing a measure of the phase and the amplitude error terms in response to the difference vectors $E_1$–$\underline{E}_n$, the phase and the amplitude error terms required to support subsequent generation of the at least one error signal.

In a particular embodiment, the method further comprises: generating the at least one error signa through isolation of the phase error term from the amplitude error term, the at least one error term satisfying the general form:

$X=P_1-P_2-P_3+P_4=-8\underline{P}p\underline{R}$;

$Y=P_1+P_2-P_3-P_4=-8\underline{A}a\underline{R}$ where a is the amplitude error term, p is the phase error term and $P_n$ are output amplitudes from the signal error detector for corresponding difference vectors $E_1$–$\underline{E}_n$.

The detector of the present invention and its corresponding method of operation may be employed within, for example, a cellular base station or the like to improve linearity.

The present invention therefore provides an improved phase and amplitude comparator particularly, but not exclusively, useful in an amplifier linearisation process. In overview, the preferred embodiments of the present invention operate to isolate small error terms from large signal terms and then to cause corrective operation on the small error terms only. In accordance with the preferred embodiments of the present invention, an improved linear power amplifier is beneficially provided in which linearisation is performed by correction to the signal envelope. Indeed, in contrast with prior art systems, the present invention advantageously overcomes two effects exhibited by conventional phase and amplitude comparator techniques, namely an ability to resolve accurately small differences between relatively large signals with high dynamic range and, second, an ability to reduce dynamic range requirements of detectors employed to ease their associated tracking requirements.

While the detector of the preferred embodiment is optimized to resolve small signal error/offsets in large dynamic ranges, the detector can, beneficially, still provide useful output even when offsets are large. Consequently, the present invention can be used in a complementary sense within a slow feedback loop.

The detector of the preferred embodiment is able to operate sufficiently fast to cope with wideband spread spectrum signals and, beneficially, has a generally simplified and robust circuit design.

BRIEF DESCRIPTION OF THE DRAWINGS

In order that the present invention can be more fully understood and to show how the same may be carried into effect, reference shall now be made, by way of example only, to the figures in the accompanying drawing sheets, in which:

FIG. 13 shows a schematic block diagram of an IQ modulator block used in FIGS. 1 and 3;

FIG. 14 shows a preferred functional configuration of a slow loop control circuit for FIG. 3;

FIGS. 15a–15d show graphical representations of variations in phase, amplitude, calculated phase offset and amplitude offset of a perfect power detector arranged to support implementation of the preferred embodiment of the present invention;

FIGS. 16a–16d shows the phase; amplitude; calculated phase offset; and calculated amplitude offset for a voltage-law detector arranged to support implementation of the preferred embodiment of the present invention;

DETAILED DESCRIPTION OF THE PREFERRED EMBODIMENTS

There will now be described, by way of example only, at least a best mode contemplated by the inventors for carrying out the invention. In the following description, numerous specific details are set out in order to provide a complete understanding of the present invention. It will be apparent, however, to those skilled in the art that the present invention may be put into practice with variations of the specific.

Figure 1:
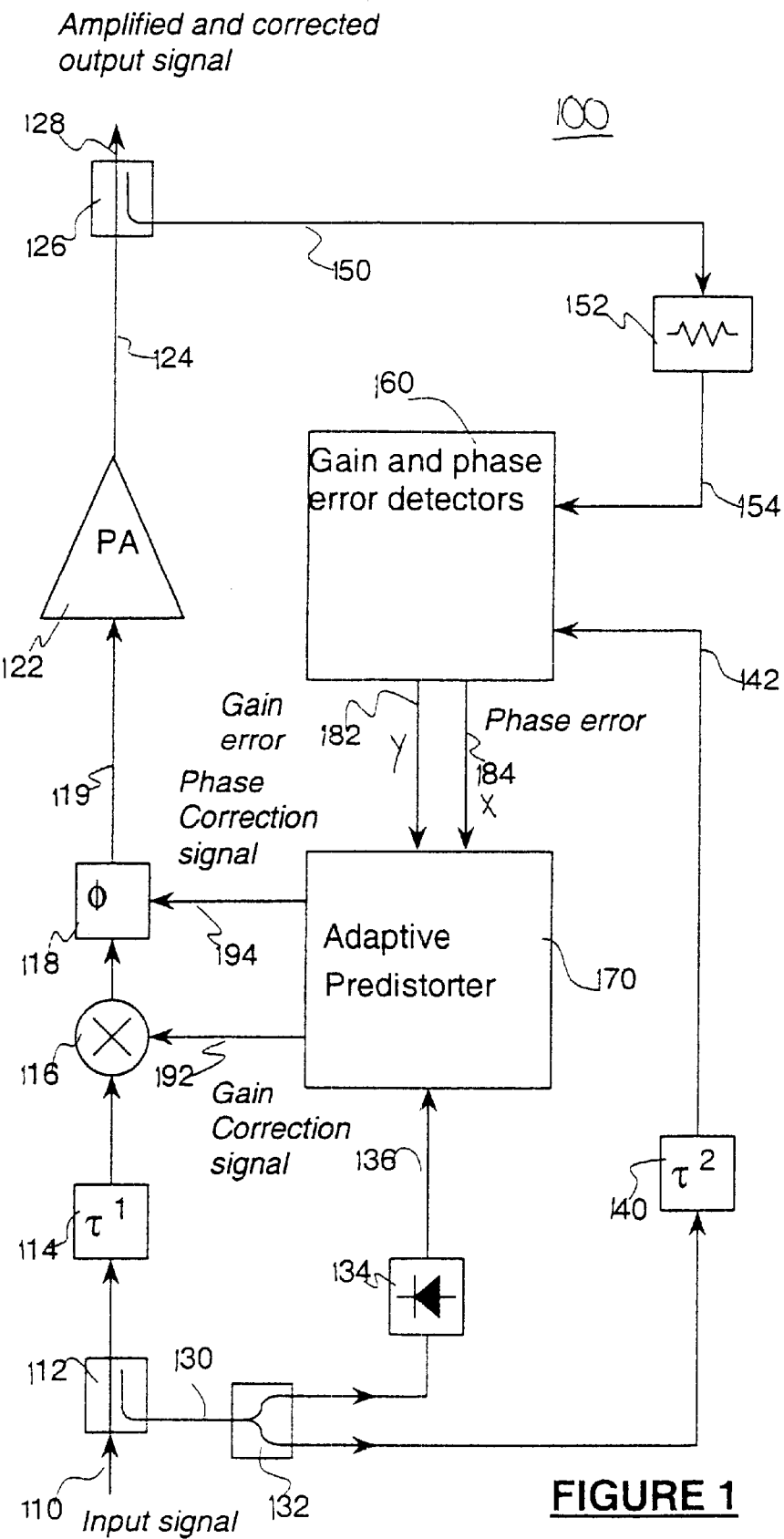
FIG. 1 shows an embodiment of a linear power amplifier arrangement able to support the underlying concepts and principles of the present invention.

FIG. 1 shows a block diagram of a linear power amplifier 100 constructed in accordance with a preferred embodiment of the present invention. In use, an RF input signal 110 is applied to a high power amplifier 122 via a directional coupler 112, a first delay line 114, an amplitude modulator 116 and a phase modulator 118. An output of the amplifier 122 provides an amplified output signal 128 which is sampled by a directional coupler 126. The sampled RF output from the directional coupler 112 is applied to a power splitter 132, the outputs of which are connected to an envelope detector 134 and a second delay line 140. The output of the envelope detector is connected to an adaptive pre-distorter subsystem 170. The adaptive pre-distorter subsystem 170 generates two outputs: a gain correction signal 192 which is connected to the control port of first amplitude modulator 116; and a phase correction signal 194 which is connected to the control port of phase modulator 118.

The adaptive pre-distorter 170 generates the amplitude and phase correction signals 192, 194 as functions of input 136 in such a way that the input signal, delayed by 114 and modulated by modulators 116, 118, on passing through the high power amplifier 122, emerges with lower distortion than if no pre-distortion subsystem had been employed. The purpose of the adaptive pre-distorter's gain and phase transfer functions is therefore to cancel the gain and phase distortion produced in the power amplifier 122. The purpose of delay line 114 is to compensate for any delay skew between the signal 110 modulation and the correction signals 192, 194 induced by processing delay in the correction path 112, 130, 134, 170.

A gain and phase error detection subsystem 160 requires, as inputs, a sample 142 of the input signal 110 and a sample 154 of the output signal 128, normalised to the same signal level and aligned in time. Output sample 154 is normalised to the same level as sample 142 by attenuating the coupled output of coupler 126 in attenuator 152. Input sample 142 is time-aligned with 154 by delaying one output of power splitter 132 in delay line 140.

In order to compensate for changes in the high power amplifier 122 gain and phase distortion characteristic, for example due to temperature or channel frequency changes, the pre-distorter 170 operates on an adaptive basis. That is, the pre-distorter 170 adaptively adjusts its gain and phase transfer functions in response to residual gain error 182 and residual phase error 184 signals fed back from the error detection subsystem 160. The pre-distortion functions therefore optimally converge as the system operates.

The path that generates the amplitude and phase correction signals 192, 194 (i.e. the path from the directional coupler 126 through the attenuator 152 and then through the gain and phase error detector 160 and the adaptive pre-distorter subsystem 170) is not a classic feedback loop. The path, in fact, is used to update coefficients in a look-up table over a relatively long period of time and so the path supports, inherently, a wideband technique. More specifically, the gain and phase error detector 160 is arranged to update the look-up table to optimize tracking of the adaptive pre-distorter to a requisite transfer function. The adaptive pre-distorter 170 looks at an input envelope emanating from the envelope detector 134 and then, with knowledge of the requisite transfer function that the circuit needs to attain to provide phase and amplitude compensation, the adaptive pre-distorter 170 selects an appropriate coefficient from the look-up table to improve amplifier linearity.

Reference signal 142, as will be appreciated, is an accurate representation of the input signal 110 that is to be amplified. Any deviation (in phase or amplitude) between the reference signal 142 and the sampled output signal 154, subject to the taking into account of fixed gain requirements and offset provided by the amplifier 122 and the attenuator 152, is therefore representative of error.

According to the present invention, the residual gain error signal 182 and the residual phase error 184 signal, produced by the gain and phase error detector 160, operate linearly over small differences in the phase and amplitude; the generation mechanism will be described in greater detail later.

Figure 2:
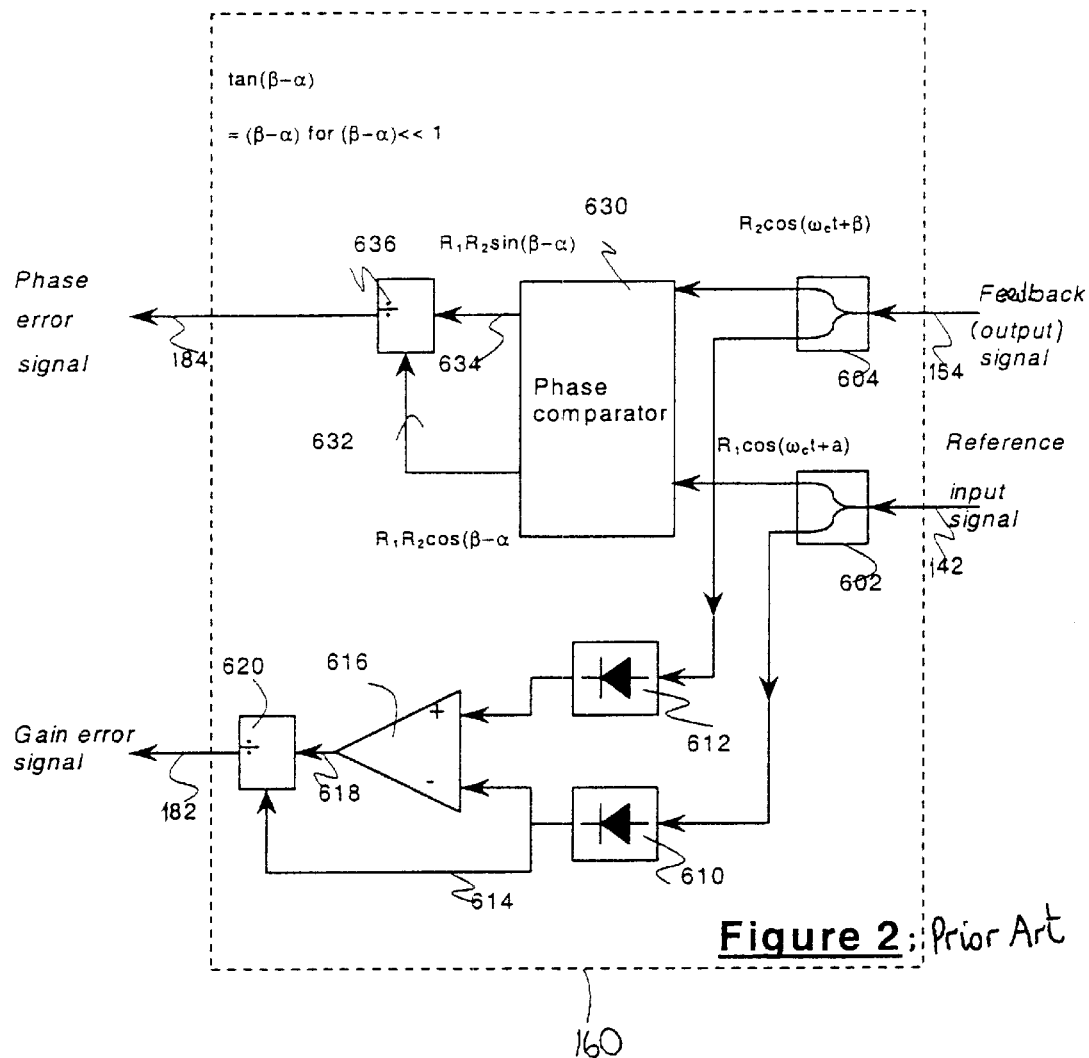
FIG. 2 shows, in detail, a conventional architecture of a gain and phase error detector suitable for use in FIG. 1.

To frame the invention in context, FIG. 2 shows, in detail, a typical architecture of a gain and phase error detector 160 that has been used conventionally. The input signals 142 and 154 are each split by power splitters 602 and 604, respectively. An output of splitter 602 is fed to envelope detector 610 and an output of splitter 604 is fed to envelope detector 612. The envelope detectors 610, 612 produce output voltages proportional to the amplitude envelope of signals 142 and 154, respectively. The output voltage of detector 610 is subtracted from the output of detector 612 by a differential amplifier 616 to produce a signal 618 proportional to the amplitude error between 142 and 154.

The difference signal 618 is divided in analogue divider block 620 by signal 614 being the output of envelope detector 610 to produce a signal 182 that is proportional to the gain error between 142 and 154. The implication of this is that the residual gain error signal 182 is a metric only of the gain distortion (amplitude compression or expansion) in the power amplifier and is independent of the input signal envelope level. This can improve the stability of an amplitude adaptation loop allowing parameter $\mu_g$ to be set more closely for rapid conversions.

Figure 4:
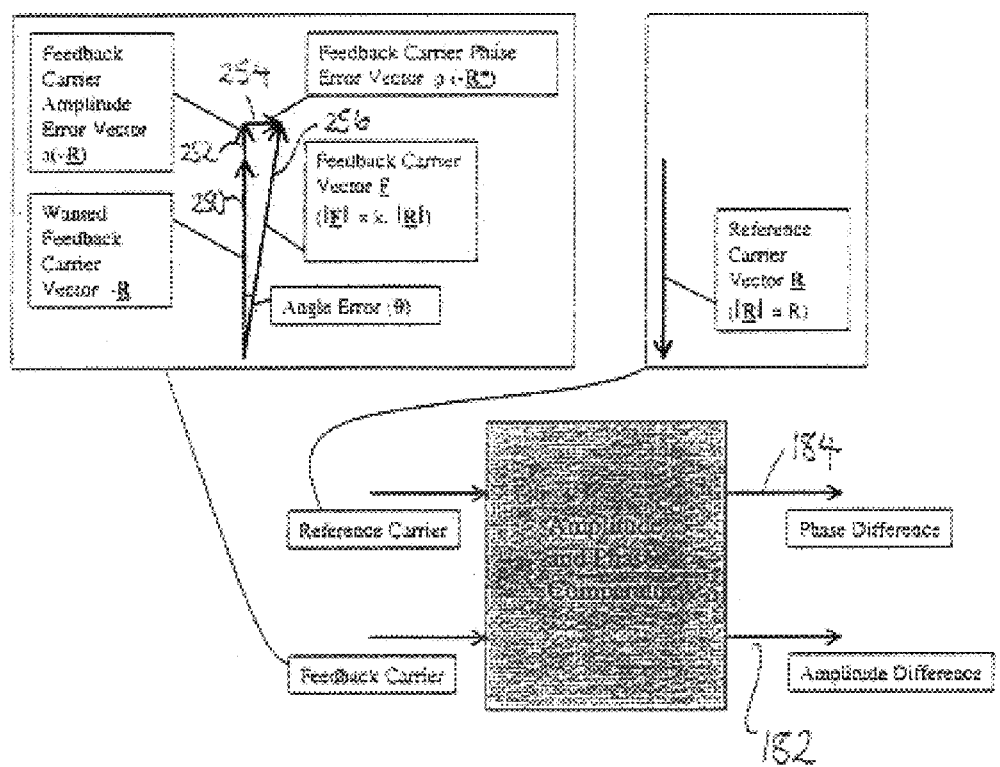
FIG. 4 shows an analysis of signals input to a linear power amplifier and phase comparator of FIG. 1.

Derivation of the residual gain error signal 182 and the residual phase error signal 184 will become apparent in the description relating to FIG. 4.

The remaining outputs of splitters 602 and 604 are fed to a phase comparator 630 which has two outputs 632 and 634. If the RF input from splitter 602 is represented in polar form by $R_1 \cdot \cos(w_c t + \alpha)$ and the RF input from splitter 604 is represented by $R_2 \cdot \cos(w_c t + \beta)$, then the response of phase comparator 630 is such that output 632 is proportional to $R_1 \cdot R_2 \cdot \cos(\beta-\alpha)$ and output 634 is proportional to $R_1 \cdot R_2 \cdot \sin(\beta-\alpha)$. Analogue divider block 636 divides output 634 by 632 to give phase error signal 184. It should be noted that this divider is merely correcting for the amplitude response of the differential phase detector and hence performs a different role to that 620 in the gain error loop. Phase error signal 184 is then equal to $\tan(\beta-\alpha)$, but for small values of $(\beta-\alpha)$ then $\tan(\beta-\alpha)$ approximates to $(\beta-\alpha)$.

Figure 3:
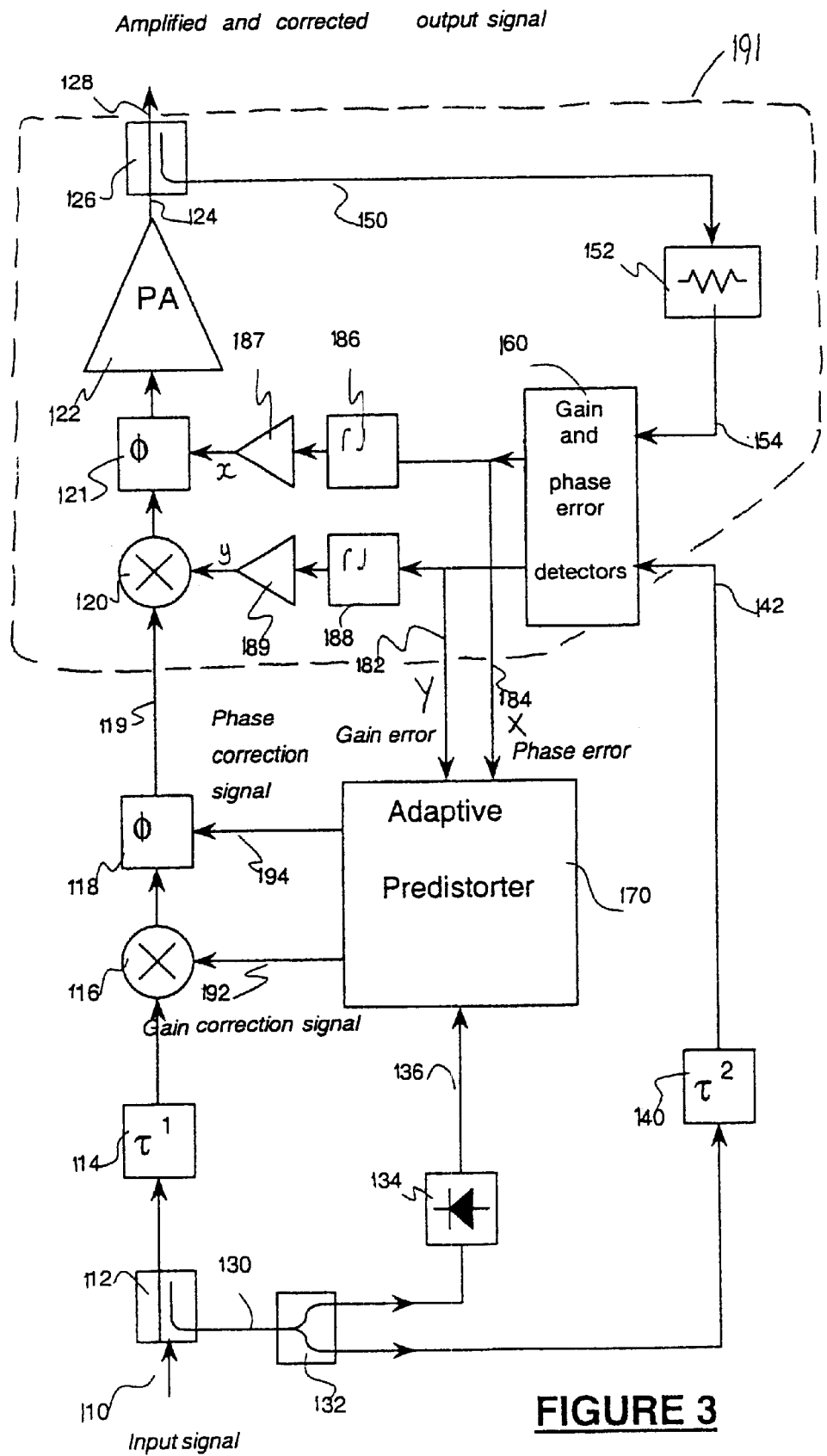
FIG. 3 shows an alternative linear power amplifier arrangement able to support the underlying concepts and principles of the present invention.

FIG. 3 shows a block diagram of the second linear power amplifier in which the system includes second amplitude 120 and second phase 121 modulators and baseband processing elements 186, 187, 188, 189. These form a slow feedback loop 191 operating in the gain and phase domains, the slow feedback loop 191 arranged to centre the operation of the adaptive pre-distorter 170 and to allow system components of greatly reduced operating range to be used. The slow feedback loop 191 provides circuit stabilization for gross error, e.g. unit-to-unit variations and component temperature dependence.

In previous, prior art systems, operation of a slow gain feedback loop was as follows. The gain error signal 182 is integrated by integrator 188 and amplified by gain block 189. A resultant loop gain correction signal ("y") is then applied to a second amplitude modulator 120 that adjusts the signal level into the second phase modulator 121 and high power amplifier 122. The arrangement forms a control loop with integral action such that the output level is adjusted to set the sampled output 152 at the same average envelope voltage as the sampled input 142. Similarly, operation of a slow phase feedback loop was as follows. The phase error signal 184 is integrated by integrator 186 and amplified by gain block 187. A resultant loop phase correction signal ("x") is then applied to a slow phase modulator 121 that adjusts the phase of the signal into the high power amplifier 122. The arrangement forms a control loop with integral action whereby the average phase of the sampled output 152 is adjusted to the same average phase as the sampled input 142.

The sampled RF output from directional coupler 112 is applied to a power splitter 132, the outputs of which are connected to an envelope detector 134 and a delay line 140. The output of the envelope detector is connected to an adaptive pre-distorter subsystem 170. The adaptive pre-distorter subsystem 170 generates two outputs: i) a gain correction signal 192 which is connected to the control port of first amplitude modulator 116; and ii) a phase correction signal 194 which is connected to the control port of first phase modulator 118. As described in relation to the first embodiment, the pre-distorter 170 adaptively adjusts its gain and phase transfer functions in response to residual gain error 182 ("Y") and residual phase error 184 ("X") signals fed back from an error detection subsystem 160 that operates as described above.

The 'slow feedback' control system nulls out the average gain and phase errors in the adaptation loop. The output of the gain error detector mentioned above is integrated and amplified to provide a control signal that modulates a gain control element between the pre-distorter and the power amplifier itself. Similarly, the output of the phase error detector mentioned above is integrated and amplified to provide a control signal that modulates a phase control element between the pre-distorter and the power amplifier. These feedback control loops adjust to trim out the amplitude and phase errors between the two signal paths into the gain and phase error detectors 160, ensuring that these the fast modulators 116, 118 and the pre-distorter 170 are operated at their optimum operating point. A further benefit is that with the slow loops controlling the average gain and phase response of the high power amplifier, the range of gain and phase adjustment required from the adaptive pre-distorter 170 is greatly reduced.

As will be appreciated, the mechanism adopted in the preferred embodiment for providing pre-distorted amplification is relatively easily realisable in discrete form and provides a completely polar-domain design which is capable of providing pre-distortion to a standalone radio frequency power amplifier rather than necessarily being incorporated into an existing DSP system. The analogue signal processing used to condition error signals and to provide input signals eliminates the need accurately to digitise wideband signals at the carrier frequency in order to drive DSP implementations of the error feedback system and pre-distorter. The correction signals from the pre-distorter are applied to the input signal via analogue radio frequency control elements such that, at no stage, is the input signal to the power amplifier required to be in the digital domain. The use of slow loops can be used to stabilise the power amplifier gain and phase response, thereby reducing the dynamic range required from a corrective look-up table of the adaptive pre-distorter 170. This is of advantage for many applications such as in the provision of high power linear amplifiers in the transmission of signals in cellular radio base stations.

To this point, the description has concentrated on the structural configuration of a linear amplification circuit (e.g. FIGS. 1 to 3), with an overview provided in terms of functional operation of the various circuit components thereof. It is now appropriate to discuss in detail a preferred mechanism for generating correction signals (X and Y) for compensating for phase error and amplitude (i.e. gain) error.

FIG. 4 shows the construction and generation of vector components 250–256 that are subject to amplitude and phase comparison in accordance with the present invention. From an illustrative perspective, it is assumed that voltage components of carrier vectors (namely reference carrier vector $\underline{R}$ and feedback carrier vector F) can be represented as voltage vectors. The two carrier vectors $\underline{R}$ and F are nominally in anti-phase; this eases implementation and does not compromise generality. The reference carrier vector $\underline{R}$ can be described as having an amplitude R. The feedback carrier vector F can be described as having a wanted component equal to, but in anti-phase with, the reference vector (i.e. $-\underline{R}$), with the feedback carrier vector F further having an amplitude error term $a.(-\underline{R})$ and a phase error term $p.(-\underline{R}^*)$ orthogonal to the amplitude error term. $\underline{R}^*$ is equal in amplitude but orthogonal to $\underline{R}$. The vector summation of the reference carrier vector $\underline{R}$ with the orthogonal error terms $a.(-\underline{R})$ and $p.(-\underline{R}^*)$ therefore defines feedback carrier vector F.

Figure 5A:
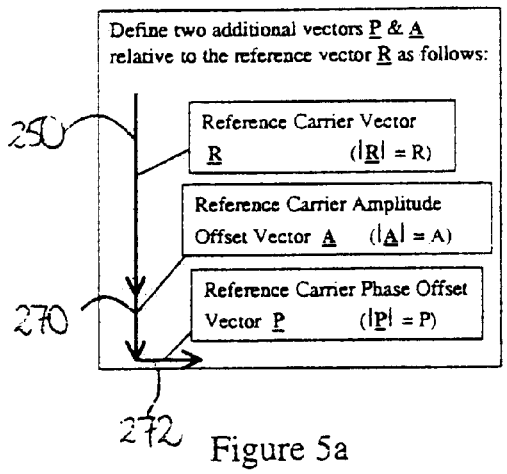
FIGS. 5a and 5b show the construction of reference vectors $\underline{R}_1$–$\underline{R}_4$ and their inter-relationship with a main reference vector $\underline{R}$ of FIG. 4.
Figure 5B:
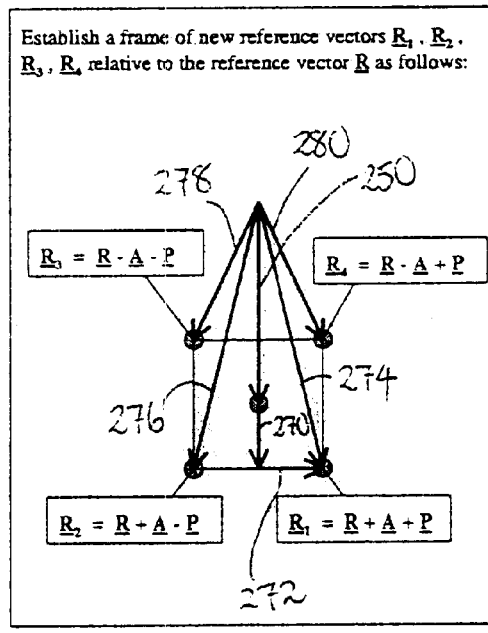

According to the underlying principle of the present invention (FIG. 5), phase and amplitude errors isolated by a vector manipulation technique involving the generation of a frame of reference vectors $\underline{R}_{1-n}$ related to the reference carrier vector $\underline{R}$ by amplitude and phase vector of predetermined magnitude. More specifically, the present invention undertakes an addition or subtraction of two further offset vectors $\underline{A}$ and $\underline{P}$ of known magnitude to the reference carrier vector $\underline{R}$, where $\underline{A}$ (reference numeral 270) is an amplitude offset in-phase with $\underline{R}$ and $\underline{P}$ (reference numeral 272) is a phase offset in quadrature with $\underline{A}$; this is shown in FIGS. 5a and 5b. In other words, $|\underline{R}|=R$, $|\underline{A}|=A$ and $|\underline{P}|=P$. The frame of reference vectors $\underline{R}_1$ to $R_n$ is therefore bounded by the known $\pm\underline{A}$ and $\pm\underline{P}$ offset vectors.

According to the present invention, there are two alternative prepositions to consider in relation to the generation of the frame of reference vectors $\underline{R}_{1-n}$. Specifically, in a first instance, the reference carrier amplitude offset and the reference carrier phase offset can both be proportional to R. Alternatively, $\underline{A}$ can be generated by limiting R to a constant amplitude so that $\underline{A}$ is fixed in amplitude and is not proportional to R. In the latter instance, $\underline{P}$ is preferably then simply in phase quadrature offset with respect to $\underline{A}$ and $\underline{P}$.

It should be noted that a quadrature relationship between the amplitude offset and phase offset vectors $\underline{A}$ and $\underline{P}$ is desirable, but not essential, with the quadrature relationship merely simplifying vectorial computation associated with isolation of the actual amplitude (gain) and phase errors and the generation of suitable correction coefficients. Indeed, an in-phase relationship between one of the amplitude offset and phase offset vectors $\underline{A}$ and $\underline{P}$ with the reference carrier vector is desirable, but not essential, although the computational mathematics involved with the isolation of the amplitude and phase error is again increased in its complexity.

In accordance with a preferred embodiment, a frame of reference vectors $\underline{R}_1$ to $\underline{R}_4$ (reference numerals 274–280) is produced relative to reference carrier vector $\underline{R}$ (reference numeral 250) through the vector additional and subtraction of amplitude offset and phase offset vectors $\underline{A}$ and $\underline{P}$. The construction of reference vector $\underline{R}_1$ is shown in FIG. 5b in some detail, i.e. through the inclusion of the constituent vector components of $\underline{R}+\underline{A}+\underline{P}$. The frame of reference vectors $\underline{R}_1$ to $\underline{R}_4$ can be represented mathematically as:

$R_1=\underline{R}+\underline{A}+\underline{P}$;

$R_2=\underline{R}+\underline{A}-\underline{P}$;

$R_3=\underline{R}-\underline{A}-\underline{P}$;

$R_4=\underline{R}-\underline{A}+\underline{P}$.

It has been appreciated that error terms in phase and amplitude can be isolated by a combinatorial mechanism in which the wanted feedback carrier vector F is added to the various reference vectors $\underline{R}_1$ to $\underline{R}_4$ of the reference frame. In other words, the wanted feedback carrier vector F is added on an individual basis to reference vectors of the reference frame to produce, in the preferred embodiment, four new difference vectors (or error terms) $E_1$, $E_2$, $E_3$ and $E_4$.

Figure 6A:
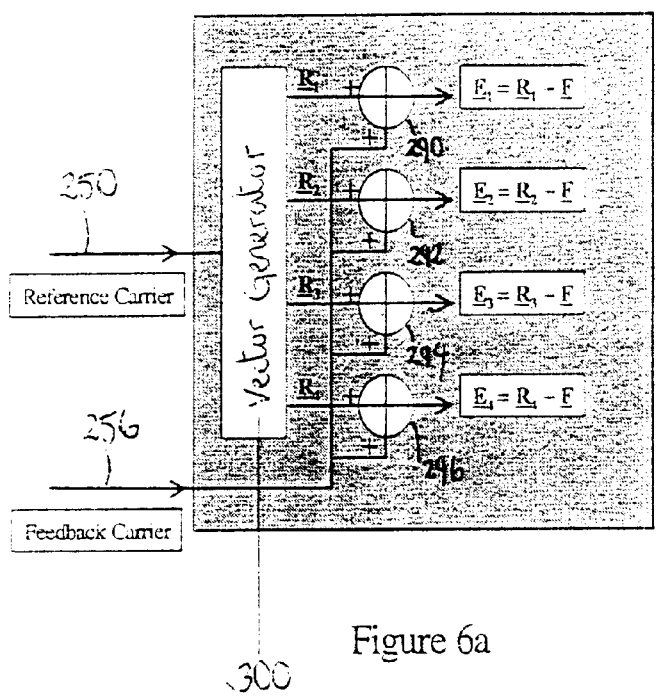
FIGS. 6a and 6b diagrammatically illustrate how difference vectors $E_1$–$E_4$ are determined for use in the linear power amplifier arrangement of FIGS. 1 and 3.
Figure 6B:
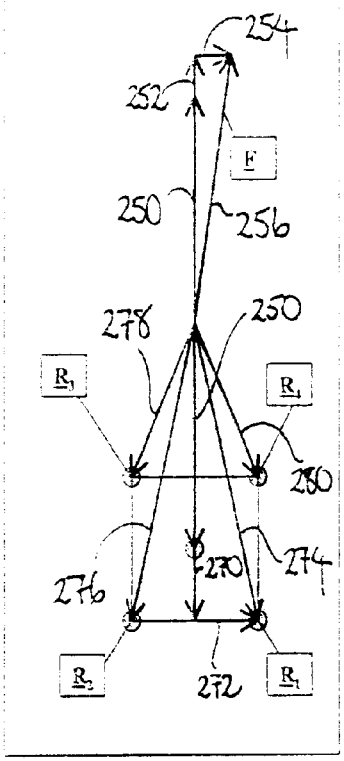

Looking first to FIG. 6a, a vector generator 300 is responsive to the reference carrier vector $\underline{R}$. The vector generator 300 operates to produce the frame of reference vectors $R_1$ to $R_4$ from the reference carrier vector $\underline{R}$. In a parallel arrangement, distinct adder circuits 290–296 are each responsive to the feedback carrier vector F and individual ones of the reference vectors $\underline{R}_1$ to $\underline{R}_4$ of the reference frame, with outputs of the adder circuits 290–296 producing respective difference vectors $E_1$, $E_2$, $E_3$ and $E_4$. FIG. 6b is a vectorial representation of the summing function performed, with the feedback vector F 256 shown to comprise a wanted signal component with amplitude 252 and phase 254 error terms.

In relation to the difference (error) vectors $E_1$, $E_2$, $E_3$ and $E_4$, these can be represented mathematically by the expressions:

$E_1=\underline{R}_1+F=(\underline{R}+\underline{A}+\underline{P})+(-\underline{R}+a(-\underline{R})+p(-\underline{R}))=\underline{A}+\underline{P}-a\underline{R}-p\underline{R}$;

$E_2=\underline{R}_2+F=(\underline{R}+\underline{A}-\underline{P})+(-\underline{R}+a(-\underline{R})+p(-\underline{R}))=\underline{A}-\underline{P}-a\underline{R}-p\underline{R}$;

$E_3=\underline{R}_3+F=(\underline{R}-\underline{A}-\underline{P})+(-\underline{R}+a(-\underline{R})+p(-\underline{R}))=-\underline{A}-\underline{P}-a\underline{R}-p\underline{R}$;

$E_4=\underline{R}_4+F=(\underline{R}-\underline{A}+\underline{P})+(-\underline{R}+a(-\underline{R})+p(-\underline{R}))=-\underline{A}+\underline{P}-a\underline{R}-p\underline{R}$.

It will now be appreciated that the difference (error) vectors $E_1$, $E_2$, $E_3$ and $E_4$ now only include the known (i.e. pre-selected) amplitude and phase offset vectors $\underline{A}$ and $\underline{P}$, as well as error terms a and p that modify the reference carrier vector $\underline{R}$ such that the products $a\underline{R}$ and $p\underline{R}$ are small. In other words, the large reference carrier vector $\underline{R}$ has been eliminated by a simple addition of the reference frame vectors with the feedback carrier vector F. Individual $\underline{E}_n$ vector components (which are, at this point, essentially radio frequency signals) are now fed to power detectors (or the like) for amplitude determination purposes. For perfect square-law power detectors, individual $\underline{E}_n$ vector components yield amplitudes:

$P_1=|E_1|^2=E_1^2=(\underline{A}-a\underline{R})^2+(\underline{P}-p\underline{R})^2$;

$P_2=|E_2|^2=E_2^2=(\underline{A}-a\underline{R})^2+(-\underline{P}-p\underline{R})^2$;

$P_3=|E_3|^2=E_3^2=(-\underline{A}-a\underline{R})^2+(-\underline{P}-p\underline{R})^2$;

$P_4=|E_4|^2=E_4^2=(-\underline{A}-a\underline{R})^2+(\underline{P}-p\underline{R})^2$.

The actual relationship between the $\underline{E}_n$ vector components and their amplitudes is subject to a scaling factor which in the above equations has been normalised to unity; this does not affect the generality of the mechanism.

As will be appreciated, the in-phase components relate to the known gain offset and gain error terms ($\underline{A}$ and a$\underline{R}$, respectively) whereas the quadrature components relate to the known phase offset and phase error terms ($\underline{P}$ and p$\underline{R}$, respectively). In essence, therefore, the process involves the expansion of the various polynomial terms to leave terms proportional to the gain and phase error terms a and p.

In the absence of error signals, for instance, when a feedback loop is closed and has converged, all four difference vectors $\underline{E}_n$ have equal amplitude. If A and P are independent (or nearly independent) of R, then the magnitudes of the difference vectors $\underline{E}_n$ at zero error will be approximately constant; this has important implications for detectors employed to measure vector magnitudes of $\underline{E}_n$ as will be described.

Figure 7:
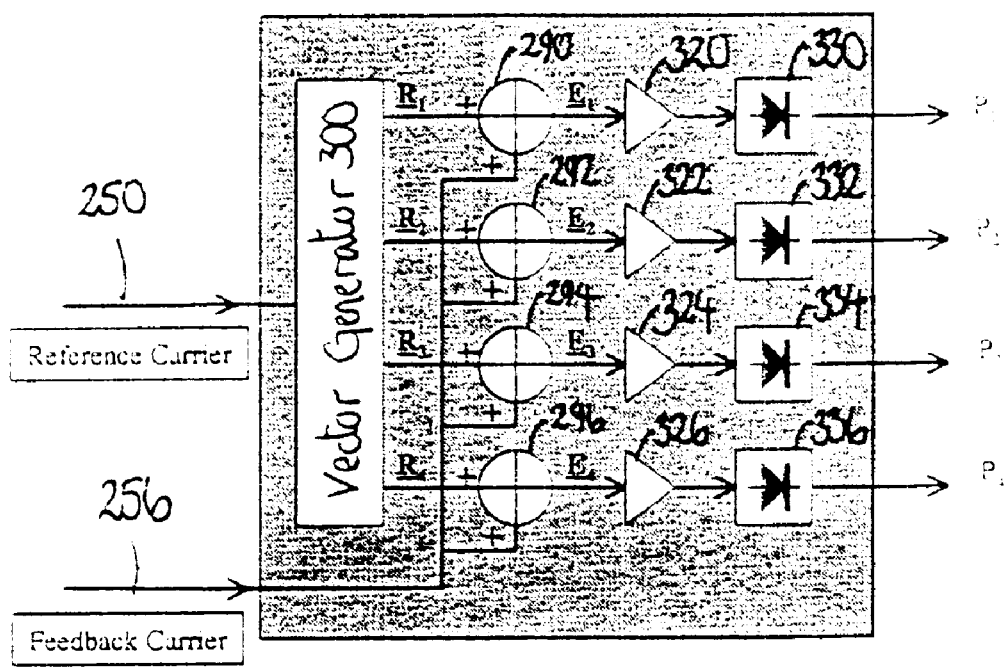
FIG. 7 shows an application of the difference vectors $E_1$–$E_4$ of FIGS. 6a and 6b.

FIG. 7 is illustrative of an arrangement suitable for detecting in-phase and quadrature components; FIG. 7 is based on FIG. 6a but further includes (in each difference vector path an (optional) amplifier 320–326 and a path-specific detector 330–336. The detectors 330–336 are preferably matched and provide, respectively, outputs $P_1$ to $P_4$.

Analysis of the process shown in FIG. 4 is simplified, initially, by assuming that true power detectors are used and so the detector outputs $P_n$ are proportional to the square of the voltage signals, $E_n$. Although this is the ideal case, it is not necessary and voltage detection or any law in between will work well.

In order to arrive at correction terms for the power amplifier configuration of FIGS. 1 or 3, gain error (Y) and phase error (X) values must be produced by the detectors in FIG. 7. In this respect, in the preferred example (indicative of an optimised case), it is necessary to undertake two separate computations with respect to detected signals $P_1$ to $P_4$. In order to isolate the error terms p and a (otherwise than through simple scaling factors of multiples of $\underline{R}$), it can be shown that signal processing of the detected signals P1 to P4 renders solutions for the gain (Y) and phase (X) errors, namely:

$X = P_1 - P_2 - P_3 + P_4 = -8\underline{P}p\underline{R};$ $Y = P_1 + P_2 - P_3 - P_4 = -8\underline{A}a\underline{R}$ It will be appreciated that X and Y are therefore purely proportional to signal errors. Indeed, referring back to FIG. 4, X is proportional to the quadrature error (phase) term p and Y is proportional to the in-phase (gain) error term a. When the error terms are zero, X and Y are zero. By normalising X and Y by dividing by R and invoking small angle theory, the exact error signals can be determined (by signal processing), the exact error signals being:

$\theta \approx \tan\theta = (p.\underline{R})/(\underline{R} + a\underline{R}) \approx p;$ $k \approx 1 + a.$ where k is the degree of gain. The analysis above has assumed perfect power detection in which $P E_n^2$+drift. The drift term can, in fact, be made to disappear with appropriate combination (either subtraction or addition) of the detected $P_1$ to $P_n$ terms. In a perfect power detector instance, it will be appreciated that if $\underline{P} \ \underline{R}$, then $X \ \underline{R}^2$.

In practice, however, there is a degradation in orthogonality of the phase and amplitude error terms p and a caused, for example, by variations in circuit performance. This affect of the error terms p and a can be illustrated by assuming that the detectors (of FIG. 7) act as voltage detectors ($P_n E_n$), rather than perfect power detectors where $P_n E_n^2$.

Figure 8A:
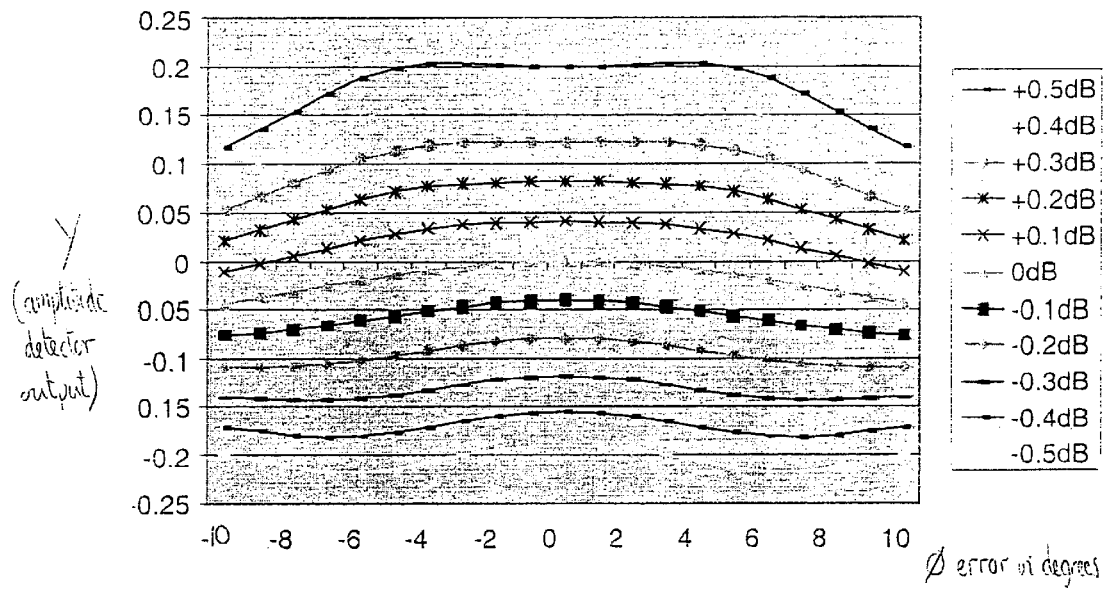
FIGS. 8a and 8b show, in accordance with the principles of the present invention, plots of variations in amplitude detector output X and phase detector output Y, respectively, as functions of phase error for different amplitude errors.
Figure 8B:
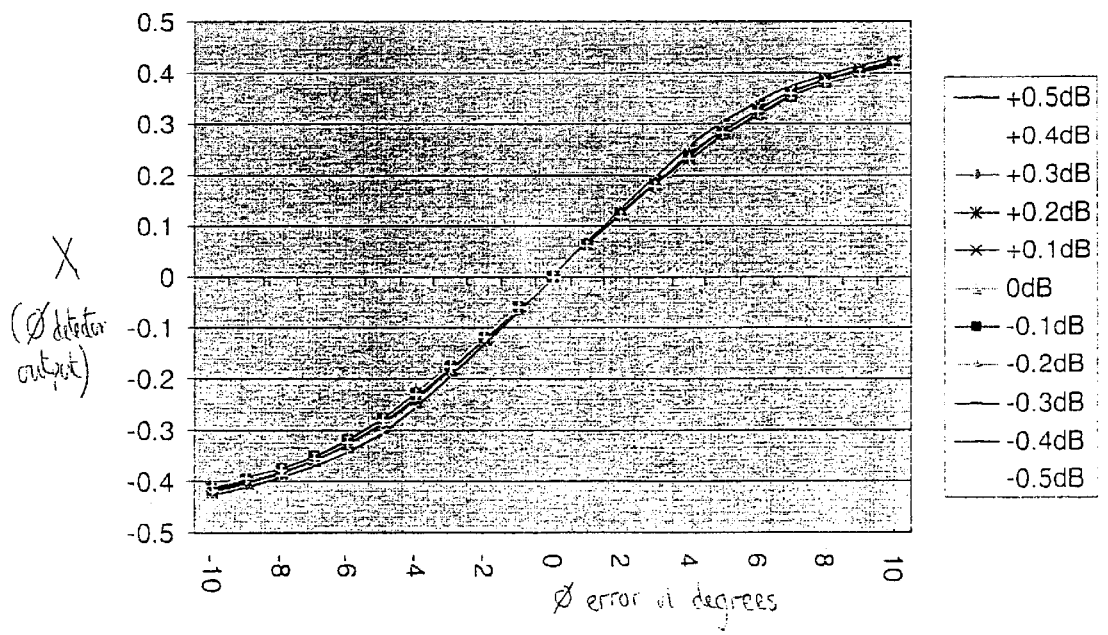

FIGS. 8a and 8b, respectively, show the variation of Y and X (ordinate axis) as a function of phase error (abscissa) for different amplitude errors; each curve represents a different amplitude error, k. FIG. 8a shows that, in accordance with the principles of the present invention, Y does not vary very much with phase error and the amplitude response is monotonic. FIG. 8b shows that X is a good measure of phase error independent of amplitude error. In other words, correct operation of the circuit does not critically depend on the nature of the operational nature of the detector circuit.

Figure 9:
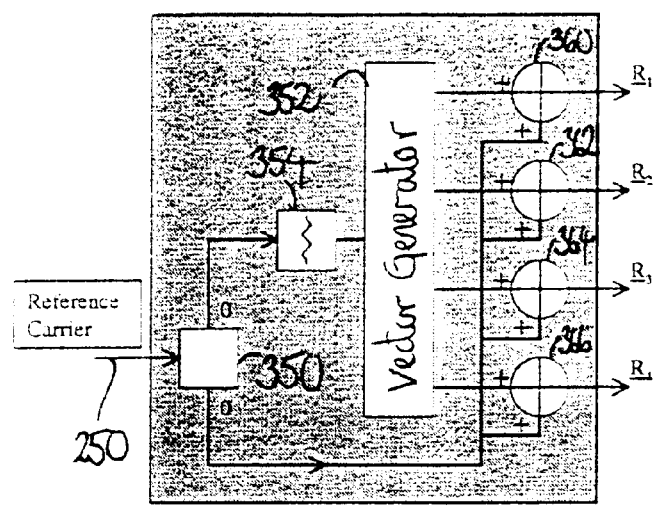
FIGS. 9 and 10 illustrate alternative mechanism for generating reference vectors $\underline{R}_1$–$\underline{R}_4$.

Referring briefly to FIG. 9, this schematic diagram embodies the principle by which the phase and gain offset vectors are made proportional to the reference carrier vector $\underline{R}$. Operation of the circuit of FIG. 9 is responsive to receipt of the reference carrier vector $\underline{R}$ by a signal splitter 350 that provides a first path to a vector generator 352 via an attenuator 354 that causes attenuation of the incident reference carrier vector $\underline{R}$. Outputs from the vector generator 352 are then combined (in summing units 360–366) with the reference carrier vector $\underline{R}$ to produce the frame of reference vectors $\underline{R}_1$ to $R_n$ (where n is at least three and most preferably four). The vector generator 352 actually acts as a splitter and phase shifter network to generate the known ±$\underline{A}$ and ±$\underline{P}$ offset vectors that are then subsequently added to the main reference carrier vector $\underline{R}$. It will be appreciated that the circuit of FIG. 9 is entirely passive and should remain stable over a wide variety of conditions. A disadvantage of the configuration and operation of FIG. 9 is that $|\underline{A}|$ and $|\underline{P}|$ (i.e. the respective magnitudes of $\underline{A}$ and $\underline{P}$) are proportional to $|\underline{R}|$. This proportionality means that X and Y will contain a term in $R^2$ as opposed to R; making normalisation relative to $\underline{R}$ harder from a signal processing perspective. More seriously, the difference vectors $\underline{E}_n$ (generated consequential to this proportionality process) at zero phase and amplitude error will be proportional to R and hence the level detectors (of FIG. 7, for example) must to operate and track each other over an entire dynamic range of the input signal.

Figure 10:
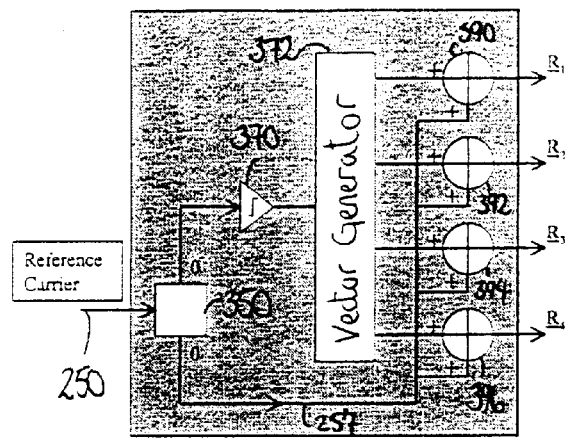
Figure 11:
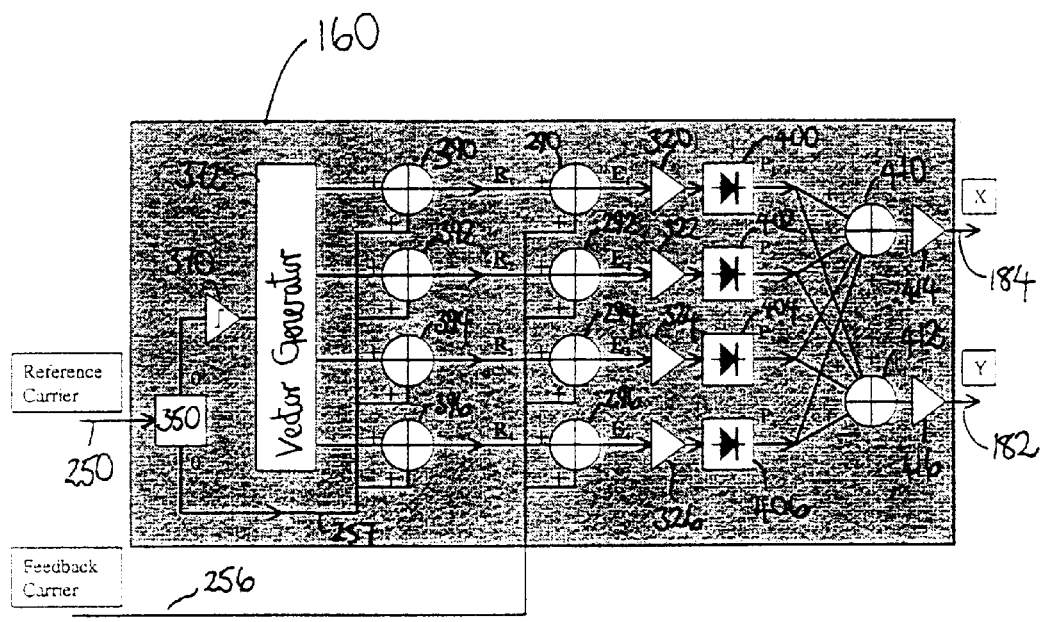
FIG. 11 shows a schematic block diagram of the phase-amplitude comparator of FIGS. 1 and 3.

In another embodiment of the present invention, FIGS. 10 and 11 illustrate a mechanisms by which the offset vectors $|\underline{A}|$ and $|\underline{P}|$ are made independent of $|\underline{R}|$. By using a combined limiter and harmonic filter 370 in substitution for the attenuator 354 (of FIG. 9) between the signal splitter 350 and a vector generator 372, a frame of reference vectors $\underline{R}_1$ to $R_n$ can be generated. More specifically, outputs from the vector generator 372 are combined (in summing units 390–396) with the reference carrier vector $\underline{R}$ to produce the frame of reference vectors $\underline{R}_1$ to $R_n$ (where n is at least three and most preferably four). The vector generator 372 actually acts as a splitter and phase shifter network to generate the known ±$\underline{A}$ and ±$\underline{P}$ offset vectors that are then subsequently added to the main reference carrier vector $\underline{R}$.

The basic structure of FIG. 10 is incorporated into FIG. 11, which latter figure further includes a second array of summing units 290–296 that operate to combine the feedback carrier vector F 256 with each of the reference vectors $\underline{R}_1$ to $R_n$ of the reference frame. In the limiting case, with the known gain and offset error terms $\underline{A}$ and $\underline{P}$ substantially constant, detectors 400–406 responsive to assigned difference (error) vectors $E_1$ to $\underline{E}_n$ are constrained to work within the reference frame defined by ±$\underline{A}$ and ±$\underline{P}$ offset and are further restricted to operate on error signals only. Furthermore, if $\underline{A}$ and $\underline{P}$ are kept substantially constant, the in-line detectors 400–406 can operate at a substantially constant level. To produce the solutions for the gain (Y) and phase (X) errors, combinatory circuitry (represented by summing blocks 410–412 coupled to each output of the various detectors 400–406) isolates the phase and gain errors in terms of the known phase (P) and gain (A) offset vectors and the reference carrier vector R, as indicated above. If required, digital linearisation can be applied to detected signals.

The majority of this system is passive and should remain stable over a wide variety of conditions. Combiners and splitters can be implemented either as resistive networks that are compact and wideband but lossy, or as printed structures; the choice being somewhat arbitrary and generally dependent on the available space and signal levels. If no correction of the detectors 400–406 is required, X and Y can be generated using simple differential amplifier techniques; this is particular so with detectors obeying a power law. Amplification of the X and Y outputs in amplifiers 414–416 may occur, if desired.

FIG. 11, which is diagrammatically indicative of the underlying principles to the present invention, allows use of detectors that are only matched at a single amplitude. Additionally, the circuit architecture inherently allows the detectors to track each other's variations. The subsequent mathematical combination cancels offsets between the detectors.

Consequently, the system of the present invention (and particularly FIG. 11) operates to converge to an origin of the wanted signal and hence to isolate phase and gain error terms.

A further source of error may be present due to imperfect generation of the reference vectors. A qualitative argument suggests that such errors will be small, since, in general, A and P are much smaller than R. The presence of the limiter 370 in FIGS. 10 and 11 also presents the possibility of AM:PM distortion in the limiter 370 which will rotate the reference frame about its centre. Because the complete system of the present invention is arranged to converge on the centre of the frame, a slight rotation will not affect the final convergence point, but will however affect the orthogonality of the phase and amplitude error signals.

The implementation of a vector generator and combiners 390–396 and 290–296 can be simplified by combining the reference carriers 257 and feedback carriers 256 before four-way addition, as is known. Extensive use can be made of Wilkinson splitter/combiners which are broadband and non critical, simplifying bulk design and implementation. The four-way splitter used for the comparative signal need not be a minimum loss design and does not need to provide infinite isolation across ports. Nevertheless, a splitter should be matched on all ports and, importantly, the topology allows for a simple coplanar layout. A phase shift network for the reference vector signal can be based on a series of λ/4 lines. Impedance transformation in each line would ensure that power is split equally between phases. There need be no isolation between sections but pads can provide isolation and maintain a good 50Ω match on all ports.

Figure 12:
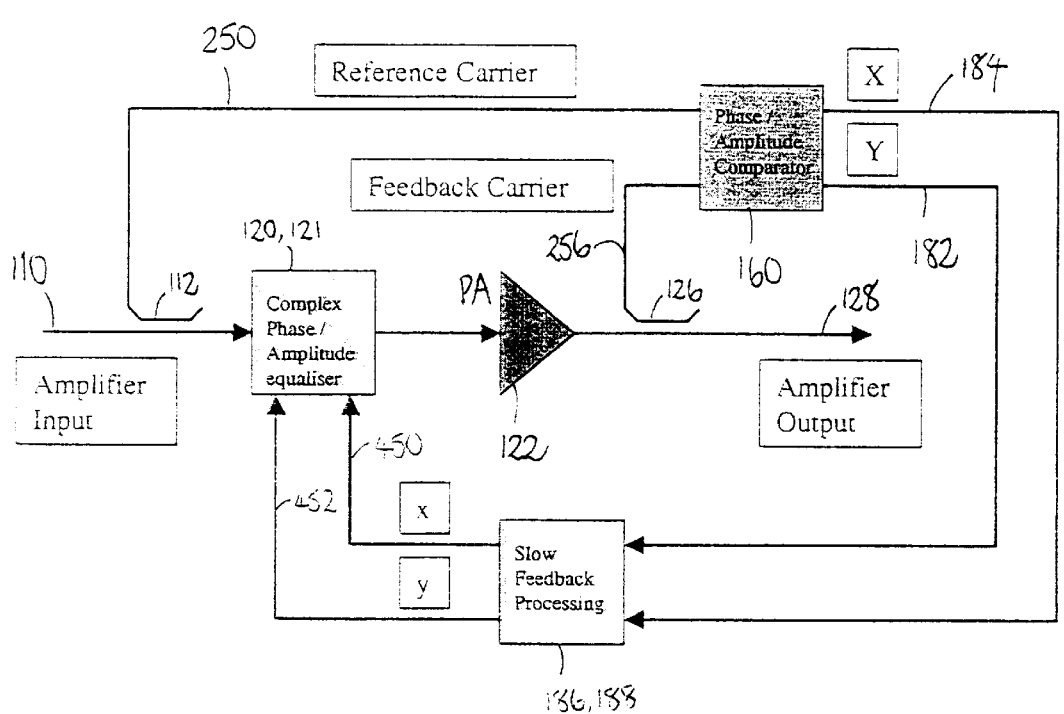
FIG. 12 shows a slow feedback loop of FIG. 1.

As described in relation to FIG. 3, a typical circuit architecture associated with an amplifier will incorporate a slow feedback loop 191 designed to track out unit-to-unit variations, thermal drift and long term drift. Use of such a slow control loop eases amplifier set-up and allows a fast feedback mechanism to operate only on amplifier induced, envelope-dependant distortion components. A slow feedback loop is illustrated in FIG. 12, with its configuration and general operation previously described in relation to FIG. 3. It will be appreciated that certain elements, e.g. delay element 140, of FIG. 3 are omitted from FIG. 12 since they do not affect slow loop operation. The functional block labelled "slow feedback processing" performs an equivalent function to the baseband processing elements (of FIG. 3) that provide the slow feedback loop phase and gain correction signals (x and y).

According to a preferred embodiment of the present invention it is desirable to use the same phase/amplitude comparator (i.e. gain and phase error detector 160) for both the pre-distortion loop (having fast modulators) and the slow loop. Use of common detector circuitry ensures that cost and complexity are minimised and, more importantly, it ensures that both the fast and the slow loops have exactly the same phase/amplitude convergence state since detector offsets are common to both loops. The slow feedback loop 191 operates to correct both the amplitude and the phase of the signal being fed to the amplifier 122. In theory, correction can be achieved in two ways, namely: i) directly using a phase modulator 121 and an amplitude modulator 120 or as a Cartesian pair of in-phase and quadrature (IQ) amplitude modulators. However, it has been appreciated that, from a practical implementation standpoint, feedback needs to be applied as a Cartesian pair (x, y) as opposed to amplitude/phase (R, θ) to avoid the need for potentially unlimited end-stops on the phase modulator and therefore to support wrap-around.

More particularly, the slow feedback loop 191 has one characteristic not present in the pre-distorter loop, namely the existence of an arbitrary phase offset across an amplifier and between elements. With time, this random phase offset will drift and so, in order to avoid a complex (and at least initial) alignment procedure, any phase shifting control elements must be continuous. In other words, phase shifting control elements must be capable of seamlessly wrapping round from 360° to 0° and have no effective end-stop. Practical analog phase shift networks are not generally continuous and have a limited range of, say, ±180°. To appreciate the problem posed by this limited range, one can consider a case where the required phase shift in the control device is +179°. Over temperature, however, the control device may suffer a drift of, say, +2°. Consequently, the required phase shift correction of +181° is not available from the control device, and there is no mechanism for switching back to −179° (i.e. the complement to +181°).

Accordingly, to construct a phase shift network that seamlessly wraps around 360° to 0°, it is necessary to use a complex IQ architecture, as shown in FIGS. 13 and 14.

In relation to FIG. 13, this is a diagrammatic representation of what the slow feedback loop is trying to achieve, with the circuit of FIG. 13 corresponding to a schematic of the complex phase/amplitude equaliser of FIGS. 3 and 12. An input signal (which may have been subject to phase and gain correction from the adaptive predistorter 170) is applied to a splitter 470 providing in-phase and quadrature signal components that are respectively applied to first 472 and second 474 multipliers. The first and second multipliers respectively modulate the quadrature and in-phase signal components with loop correction signals (y and x, respectively) 452, 450. Following modulation (to correct for gain and phase errors pertaining to the requirement for the slow feedback loop 191), the in-phase and quadrature components are combined in a combiner 476 that provides an output to the power amplifier 122.

Referring now to FIG. 14, the slow feedback loop can be considered to be comprised from two sub-loops associated with phase and amplitude (or IQ loops). An important point to notice is that the variables are orthogonal and so the behaviours of the two loops do not interact. With application of the residual gain error 182 ("Y") and residual phase error 184 ("X") signals (produced from the gain and phase error detectors 160 of the preferred embodiment of the present invention) to a quadrature to amplitude/phase (R, θ) domain converter 490, distinct phase angle θ (reference numeral 500) and amplitude R (reference numeral 502) components are generated. The amplitude 502 and phase 500 signals are integrated by irrespective amplitude 504 and phase 506 integrators with resultant time-integrated signals converted back into the IQ domain by converter 508 to provide the loop correction signals x and y (identified as reference numerals 450 and 452 in FIGS. 12 and 14). It is the phase integrator 506 that provides the requisite wrap-around function for slow-loop phase control in FIG. 3.

There are no particular speed or transient response requirements from the slow loop; once locked, changes are slow and continuous in nature. This simplifies the design of the two constituent loops in that simple first order loops with integrators, which are unconditionally stable, are generally adequate. An integrator is preferred to a simple low pass network because the (theoretically) infinite DC gain ensures that phase and amplitude errors are tracked exactly. Extra phase margin may be desirable if there is considerable inter-reaction between the loops. The operation of the two integrators now are quite different. The phase integrator has to be continuous and must wrap round from 360° back to 0°. The output of the amplitude integrator needs to be bounded; once the maximum or minimum allowable amplitude is reached, the integrator output must hold constant and not wrap from maximum to minimum amplitude.

The circuitry of FIG. 14 is preferably realised as logic functions in a digital signal processing (DSP) platform. Advantageously, by performing processing in the digital domain, errors in the analog to digital conversion process remain common to the fast and slow loops whereby the loops retain their common convergence point. In addition, in contrast with the analog domain, processing in the digital domain is more repeatable and flexible and the necessary continuous phase response is simple to achieve.

The skilled addressee will appreciate that, prima facie, error signals provided by a phase/amplitude comparator are cartesian (approximating to phase and amplitude for small errors) in nature, thereby allowing a slow loop to be closed directly. Unfortunately, direct loop closure is only possible in the case where the phase shift in a reference carrier arm is the same as a phase shift to an equaliser input of the comparator; this, in practice, is difficult to achieve. Consequently, from a practical perspective, it has been assumed that there is an arbitrary phase shift in the loop. Consequently, in accordance with a preferred embodiment, in order to track out arbitrary phase shifts, the process is performed in the phase (IQ) domain.

As was shown above, for perfect power law detection:

$X = -8\,P\,p\,R;$ and $Y = -8\,A\,a\,R.$ where X is proportional to the quadrature error term, p, and Y is proportional to the in-phase error term, a. When the error terms are zero, X and Y are zero. Normalisation by R and addition of a constant merely produces the requisite form of error signal stipulated by the preferred embodiment of the present invention. Unfortunately, with detectors generally following an imperfect detector law, detector tracking errors become more and more significant with greater displacement from the convergence point of the frame of reference vectors (shown in FIG. 5b). FIG. 15 shows circuit performance of a perfect power law detector over a phase range of ±180° and amplitude range of ±5 dB. FIG. 15 is therefore an extended version of the plot of FIG. 8. FIG. 15 can be contrasted with FIG. 16 which shows operational performance of a voltage law detector configuration over a corresponding phase range of ±180° and amplitude range of ±5 dB.

In both FIGS. 15 and 16, the abscissa axis is phase error, with the ordinate axes of FIGS. 15a, 15b, 16a and 16b being phase detector output and the ordinate axes of FIGS. 15c, 15d, 16c and 16d being amplitude detector outputs for different amplitude errors. In FIG. 15a, a perfect power detector is assumed and the values of p and a are derived for the case of R=1; A=0.1 and P=0.1 (as in FIGS. 8a and 8b). Next, the value of the phase and amplitude offsets were calculated from p and a and are plotted on FIGS. 15b and 15d (i.e. signals 500 and 502 of FIG. 14). FIG. 16 shows the affect of use of an imperfect power detector.

It can be shown, mathematically, that the phase offset $\underline{P} = \text{Arctan}\,\{p/(a+1)\}$ and that the amplitude offset $\underline{A} = \sqrt{\{p^2 + (a+1)^2\}} - 1$. From the plots in FIGS. 15 and 16, it should be noted that there is no correlation between the calculated phase offset and the calculated amplitude offset.

The graphical representations in FIG. 15 demonstrate that, with use of perfect power detectors in the preferred embodiment and limited processing capabilities, the phase and amplitude errors can be calculated with sufficient accuracy to generate perfect error signals x and y for the feedback control integrators of FIG. 12.

It has also been appreciated that, with the exception of an error signal at exactly 180° (which is an unstable equilibrium), the polarity of p can be used as an indicator of whether the phase needs to be advanced or retarded. Feeding p directly into the phase integrator of FIG. 16 therefore produces a converging loop that will become linear and well behaved as the phase error diminishes. Using the Arctan function (instead of p) provides some additional benefit, but this is achieved at the expense of an overall (and generally significant) increase in signal processing.

Looking at the amplitude response of FIGS. 15 and 16, it can be seen that the polarity of both a and the calculated amplitude offset will not allow an amplitude loop to converge until the phase has converged within about ±30°. A detailed offset calculation may improve accuracy, but at the cost of increased processing requirements, as will now be appreciated.

Unlike the detection process of the preferred embodiment, the generation of x and y (i.e. the control signals for the complex phase/amplitude equaliser) must have sufficient resolution to ensure that any phase and amplitude dither is well within acceptable limits.

It will be appreciated that there are alternative mechanism for generating x and y, although a preferred embodiment utilises a look-up table in which are stored correction codes for detected gain and phase errors. Clearly, a particular embodiment may take advantage of the fact that processing required in each quadrant (or even octant) is essentially equivalent with other quadrants (or octants), albeit that there is a sign shift. Furthermore, in generality, the conversion of amplitude and phase to x and y needs to take account of any non-linear response of the control elements, as shown in FIG. 14, as will be appreciated.

The preferred embodiment of the present invention provides error and gain detection that can support, in the context of a perfect power detector having sufficient processing capabilities, orthogonal error signals. With a voltage detector, an error signal derived directly from X and Y works as well as processed error signals. In practice, with the detector law actually fluctuating between a power regime and a voltage regime over a range of input levels, the use of X and Y to provide the phase error and the amplitude error directly to their respective integrators greatly simplifies processing.

From an implementation perspective, it has been appreciated that the amplitude loop will only converge once the phase loop is within about ±30°, so it is preferable that the phase loop be made to operate considerably faster than the amplitude loop.

Figure 17:
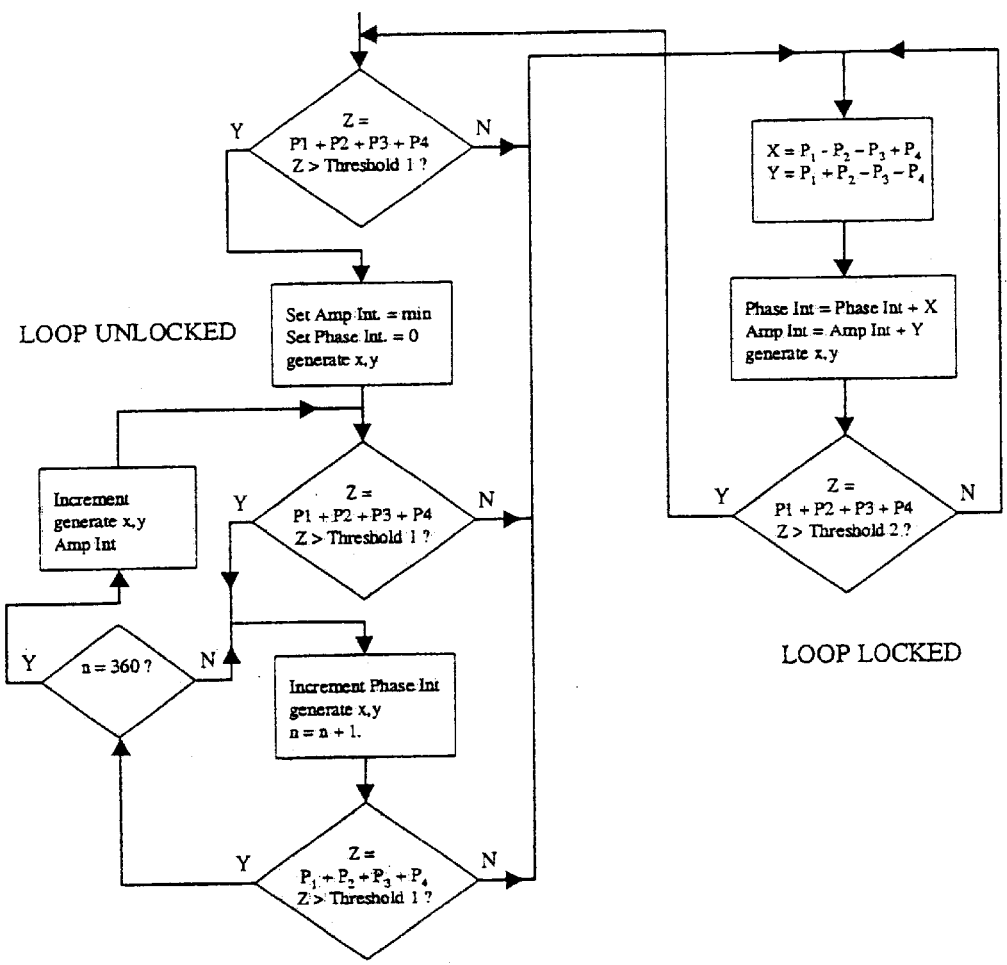
FIG. 17 shows a preferred flow chart of an aided loop acquisition scheme in accordance with the present invention.

With non-perfect power law detectors, tracking between detectors can affect performance. More specifically, at the convergence point in the reference frame (i.e. when the loop has converged to correct operation), all detectors operate on nominally the same constant power and so offsets in $P_n$ arising from the use of different detectors can be calibrated at this point. Significantly, away from convergence, the situation changes with the magnitudes of $P_n$ potentially becoming large in comparison with X or Y. Consequently, even small percentage errors in tracking of the detectors can become very significant once X and Y are derived. A robust solution to this potential problem of false locking of the slow feedback loop relies on digitising the power detector outputs, $P_n$, and performing the processing of X and Y digitally. The power associated with products of the digital processing can be used to detect when the loop is a long way from lock, e.g. does the cumulative power of the detectors exceed a predetermined threshold, i.e. $P_1+P_2+P_3+P_4$ >Threshold. Provided that the threshold condition has been satisfied, then a hunting algorithm can be instigated (starting from low gain and scanning phase, then incrementing the amplitude and repeating). The slow feedback loop can be closed once cumulative power value of $P_1+P_2+P_3+P_4$ drops below the threshold; this is shown in FIG. 17.

While the preferred embodiment of the present invention is described in the context of a four-vector solution, it will be appreciated that a frame of reference vectors $R_1$ to $R_n$ can contain fewer or more reference vector components (where n is an integer equal or greater than three). In this respect, the increase or decrease in the number of vector components within the frame has the affect of increasing processing requirements. The four-vector frame solution discussed in the context of the preferred embodiment is, however, believed to represent an (but exemplary) optimum solution.

It will, of course, be understood that the above description has been given by way of example only and that modifications in detail may be made within the scope of the present invention, e.g. variations of the error detector 160 are possible. For example, depending on the performance required, the amplitude analogue divider 620 may be omitted (although $\mu_g$ will need to be set to a lower value in order to preserve a loop stability). An alternative configuration of amplitude detectors and signal processing elements may be used. Alternative types of phase discriminator may also be used. A variation of the error detector 160 may be implemented which generates error signals 182, 184 relating to the signs of the amplitude and phase errors only, as are commonly employed elsewhere in the field of control systems.

The error detection block 160 may be partially or entirely replaced by digital implementation, wherein the RF signals 142, 154 are digitised and the error signals 82, 84 are computed by a digital signal processing (DSP). The feeding of these error signals to gain blocks 724, 754 into the adaptive pre-distorter (70) can then be performed in the digital domain. Indeed, alternative embodiments of the invention may be implemented as computer program code encoded on a computer program product for use with a computer system. A series of computer instructions embodies all or part of the functionality previously described herein with respect to the system. Software embodiments of the invention may be implemented in any conventional computer programming language. For example, preferred embodiments may be implemented in a procedural programming language (e.g. "C") or an object oriented programming language (e.g. "C++").

Although the preferred operating method may be realised by general or specific-purpose processor or logic circuits programmed with suitable machine-executable instructions, hardware components may be used to implement certain features of the present invention. Of course, the present invention is likely to be performed by a combination of hardware and software.

We claim:

1. A detector operable to provide at least one error signal associated with at least one of a phase error term and an gain error term between a reference signal $\underline{R}$ and a feedback signal F, the detector comprising:

a vector generator responsive to the reference signal $\underline{R}$, the vector generator producing a frame of reference vectors $\underline{R}_1 - R_n$ generated by a combination of the reference signal $\underline{R}$ with first $\underline{A}$ and second $\underline{P}$ offset vectors that provide an amplitude and phase displacement of the reference signal $\underline{R}$;

a signal combiner arranged to generate difference vectors $E_1 - \underline{E}_n$ by combining the frame of reference vectors $\underline{R}_1 - R_n$ and the feedback signal F, the difference vectors $E_1 - \underline{E}_n$ expressing the phase (p) and the gain (a) error terms relative to the reference signal $\underline{R}$ and the first $\underline{A}$ and second $\underline{P}$ offset vectors; and an error signal detector responsive to the difference vectors $E_1 - \underline{E}_n$ and arranged to provide a measure of the phase (p) and the gain (a) error terms required to support subsequent generation of the at least one error signal; and wherein n is an integer greater than one.

2. The detector according to claim 1, wherein the frame of reference vectors has at least three reference vectors $\underline{R}_1 - R_n$ and preferably four reference vectors $\underline{R}_1 - R_n$.

3. The detector according to claim 2, wherein the frame of reference vectors $\underline{R}_1 - R_n$ are defined as:

$\underline{R}_1 = \underline{R} + \underline{A} + \underline{P}$;

$R_2 = \underline{R} + \underline{A} - \underline{P}$;

$R_3 = \underline{R} - \underline{A} - \underline{P}$;

$\underline{R}_4 = \underline{R} - \underline{A} + \underline{P}$.

4. The detector according to claim 1, wherein the first and second offset vectors are one of:

independent of $\underline{R}$ with R limited to a constant amplitude and such that the first offset vector is fixed in amplitude and is not proportional to R; and proportional to $\underline{R}$.

5. The detector according to claim 1, wherein the first $\underline{A}$ and second $\underline{P}$ offset vectors that are in-phase and in quadrature with the reference signal $\underline{R}$.

6. The detector according to claim 1, wherein magnitudes of the first $\underline{A}$ and second $\underline{P}$ offset vectors are equal.

7. The detector according to claim 1, wherein the feedback vector is related to the reference signal $\underline{R}$.

8. The detector according to any preceding claim, wherein isolation of the phase and gain error terms contains a term proportional to the reference signal $\underline{R}$.

9. The detector according to claim 1, further comprising combinatory circuitry coupled to the error signal detector and arranged to receive output signals from the error signal detector, the combinatory circuitry configured to isolate the phase error term and the gain error term in terms of the first $\underline{A}$ and second $\underline{P}$ offset vectors and the reference carrier vector $\underline{R}$.

10. The detector according to claim 9, wherein the combinatory circuitry generates the at least one error signal through isolation of the phase error term from the gain error term, the at least one error term satisfying the general form:

$$X = P_1 - P_2 - P_3 + P_4 = -8\underline{P}p\underline{R};$$

$$Y = P_1 + P_2 - P_3 - P_4 = -8\underline{A}a\underline{R}$$

where and $P_n$ are output amplitudes from the signal error detector for corresponding difference vectors $E_1-\underline{E}_n$.

11. The detector of any preceding claim, further comprising a splitter coupled to receive, in use, the reference signal $\underline{R}$, the splitter coupled to the vector generator through a first path containing one of:
   an attenuator arranged to cause attenuation of the incident reference carrier vector $\underline{R}$; and
   a combined limiter and harmonic filter.

12. A phase and amplitude comparator operable to provide signals relating to the difference in phase and amplitude between a reference signal $\underline{R}$ and a feedback signal F wherein the comparator comprises vector generating means to produce four reference vectors $\underline{R}_1-R_n$ which are related to the input reference vector signal $\underline{R}$ by the addition of further vectors $\pm\underline{A}$ and $\pm\underline{P}$ which are, respectively, in phase and in quadrature with $\underline{R}$ such that:

$$\underline{R}_1 = \underline{R} + \underline{A} + \underline{P};$$

$$\underline{R}_2 = \underline{R} + \underline{A} - \underline{P};$$

$$\underline{R}_3 = \underline{R} - \underline{A} - \underline{P};$$

$$\underline{R}_4 = \underline{R} - \underline{A} + \underline{P};$$

wherein the four reference vectors $\underline{R}_1-R_n$ are added to four samples of the feedback signal F to produce four corresponding error vectors $E_1-E_4$, whereby the vectors $E_1-E_4$ are used to generate phase and amplitude comparative signals; and
   wherein n is an integer greater than one.

13. An amplifier circuit comprising:
   an input coupled to receive, in use, a reference signal $\underline{R}$;
   phase and gain modulators coupled to the input;
   an amplifier coupled to the phase and gain modulators;
   a first directional coupler coupled to the input and arranged to sample the reference signal $\underline{R}$;
   a second directional coupler coupled to the amplifier and arranged to sample an amplified version of the reference signal $\underline{R}$, thereby to provide a feedback signal F; and
   a detector operable to provide at least one error signal associated with at least one of a phase error term and an gain error term between a reference signal $\underline{R}$ and a feedback signal F the detector having:
      a vector generator responsive to the reference signal $\underline{R}$, the vector generator producing a frame of reference vectors $\underline{R}_1-R_n$ generated by a combination of the reference signal $\underline{R}$ with first $\underline{A}$ and second $\underline{P}$ offset vectors that provide an amplitude and phase displacement of the reference signal $\underline{R}$;
      a signal combiner arranged to generate difference vectors $E_1-\underline{E}_n$ by combining the frame of reference vectors $\underline{R}_1-R_n$ and the feedback signal F, the difference vectors $E_1-\underline{E}_n$ expressing the phase (p) and the gain (a) error terms relative to the reference signal $\underline{R}$ and the first $\underline{A}$ and second $\underline{P}$ offset vectors; and
      an error signal detector responsive to the difference vectors $E_1-\underline{E}_n$ and arranged to provide a measure of the phase (p) and the gain (a) error terms required to support subsequent generation of the at least one error signal;
   the detector coupled to the first directional coupler and the second directional coupler to receive, in use, the reference signal $\underline{R}$ and the feedback signal F;
   wherein the phase and gain modulators are arranged to receive phase and gain corrections signals derived from the at least one error signal generated by the detector; and
   where n is an integer greater than one.

14. The amplifier circuit of claim 13, further comprising an adaptive pre-distorter coupled to receive the at least one error signal from the detector, the adaptive pre-distorter further coupled to the phase and gain modulators, the adaptive pre-distorter arranged to determine the gain and phase error correction signals with respect to a set of look-up values, thereby to linearise performance of the amplifier.

15. The amplifier circuit of claim 13, further comprising a slow feedback loop containing a phase/amplitude equalizer having a second amplitude modulator and a second phase modulator coupled to the amplifier, the phase/amplitude equalizer further containing baseband processing elements coupled to the detector and arranged to receive, in use, the at least one error signal as a control signal for the baseband processing elements, whereby the phase/amplitude equalizer is arranged to track out circuit variations arising from at least one of unit-to-unit variations, thermal drift and long-term component drift through amplitude and phase control of, respectively, the second amplitude modulator and the second phase modulator.

16. The amplifier circuit of claim 15, wherein the phase amplitude equalizer further includes:
   a quadrature to amplitude/phase (R, θ) domain converter coupled to receive the at least one error signal (YX) and arranged to provide distinct phase angle θ and amplitude R components;
   a phase integrator coupled to the quadrature to amplitude/phase (R, θ) domain converter and arranged to receive, in use, the phase angle θ component, thereby to provide a first time-integrated signal having a wrap-around phase correction function;
   an amplitude integrator coupled to the quadrature to amplitude/phase (R, θ) domain converter and arranged to receive, in use, the phase angle θ component, thereby to provide a second time-integrated signal;
   an amplitude/phase (R, θ) domain to quadrature converter coupled to the phase integrator and the amplitude integrator and arranged, in use, to combine the first time-integrated signal and the second time-integrated signal to exercise control of the slow feedback loop.

17. The amplifier circuit of claim 13, further comprising at least one delay line operable to compensate for any delay skew induced by processing delay in a correction path between the reference signal and correction signals.

18. A method of detecting at least one of a phase error term and an amplitude error term between a reference signal $\underline{R}$ and a feedback signal $\underline{F}$ and generating a corresponding error signal (Y,X) in response to the least one of the phase error term and the amplitude error term, the method comprising:

producing a frame of reference vectors $\underline{R}_1$–$\underline{R}_n$ generated by a combination of the reference signal $\underline{R}$ with first $\underline{A}$ and second $\underline{P}$ offset vectors that provide an amplitude and phase displacement of the reference signal $\underline{R}$;

generating difference vectors $\underline{E}_1$–$\underline{E}_n$ by combining the frame of reference vectors $\underline{R}_1$–$\underline{R}_n$ and the feedback signal $\underline{F}$, the difference vectors $\underline{E}_1$–$\underline{E}_n$ expressing the phase (p) and the amplitude (a) error terms relative to the reference signal $\underline{R}$ and the first $\underline{A}$ and second $\underline{P}$ offset vectors; and providing a measure of the phase (p) and the amplitude (a) error terms in response to the difference vectors $\underline{E}_1$–$\underline{E}_n$ the phase (p) and the amplitude (a) error terms required to support subsequent generation of the at least one error signal; and wherein n is the integer greater than one.

19. The method of detecting according to claim 18, further comprising:

generating the at least one error signal through isolation of the phase error term from the amplitude error term, the at least one error term satisfying the general form:

$$X = P_1 - P_2 - P_3 + P_4 = -8\underline{P}p\underline{R};$$

$$Y = P_1 + P_2 - P_3 - P_4 = -8\underline{A}a\underline{R}$$

where and $P_n$ are output amplitudes from the signal error detector for corresponding difference vectors $E_1$–$\underline{E}_n$.

* * * * *